(12) United States Patent
Lin et al.

(10) Patent No.: US 11,011,481 B2
(45) Date of Patent: May 18, 2021

(54) CONFIGURABLE RESISTOR

(71) Applicant: Intel Corporation, Santa Clara, CA (US)

(72) Inventors: Kevin L. Lin, Beaverton, OR (US); James M. Blackwell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/461,546

(22) PCT Filed: Dec. 29, 2016

(86) PCT No.: PCT/US2016/069084
§ 371 (c)(1),
(2) Date: May 16, 2019

(87) PCT Pub. No.: WO2018/125110
PCT Pub. Date: Jul. 5, 2018

(65) Prior Publication Data
US 2019/0355678 A1 Nov. 21, 2019

(51) Int. Cl.
*H01L 23/64* (2006.01)
*H01C 10/16* (2006.01)
(Continued)

(52) U.S. Cl.
CPC .......... *H01L 23/647* (2013.01); *H01C 10/16* (2013.01); *H01L 21/32136* (2013.01);
(Continued)

(58) Field of Classification Search
CPC ............ H01L 23/647; H01L 21/32136; H01L 23/5228; H01L 23/5252; H01L 28/20–26;
(Continued)

(56) References Cited

U.S. PATENT DOCUMENTS

| 4,383,165 A | 5/1983 | Smith et al. |
| 5,670,825 A | 9/1997 | Hyde et al. |

(Continued)

FOREIGN PATENT DOCUMENTS

| JP | 2008103565 A | 5/2008 |
| KR | 19980012902 U | 6/1998 |
| WO | 2018125110 A1 | 7/2018 |

OTHER PUBLICATIONS

International Search Report and Written Opinion issued in PCT Application No. PCT/US2016/069084 dated Sep. 19, 2017; 11 pages.

(Continued)

*Primary Examiner* — Shahed Ahmed
(74) *Attorney, Agent, or Firm* — Patent Capital Group

(57) ABSTRACT

In an example, there is disclosed a configurable impedance element, having: a first impedance network including a plurality of series impedance elements and providing an initial impedance; a trim impedance network parallel to the first impedance network, including a plurality of corresponding impedance elements to the impedance elements of the first impedance network; and antifuses between the impedance elements of the first impedance network and their corresponding impedance elements of the trim network. There is also disclosed an integrated circuit including the impedance element, and a method of manufacturing and configuring the impedance element.

14 Claims, 15 Drawing Sheets

(51) Int. Cl.
*H01L 21/3213* (2006.01)
*H01L 23/522* (2006.01)
*H01L 23/525* (2006.01)
*H01L 27/06* (2006.01)
*H01L 49/02* (2006.01)
*H03K 19/08* (2006.01)

(52) U.S. Cl.
CPC ...... *H01L 23/5228* (2013.01); *H01L 23/5252* (2013.01); *H01L 27/0629* (2013.01); *H01L 28/20* (2013.01); *H03K 19/08* (2013.01)

(58) Field of Classification Search
CPC ..... H01L 27/0629–0635; H01L 27/016; H01L 21/823842; H01L 28/26; H01L 28/24; H01C 10/16; H01C 13/02; H03K 19/08
See application file for complete search history.

(56) References Cited

U.S. PATENT DOCUMENTS

| | | | |
|---|---|---|---|
| 5,813,881 A * | 9/1998 | Nathan | H05K 7/1092 439/516 |
| 7,981,756 B2 | 7/2011 | Lindert et al. | |
| 8,519,510 B2 | 8/2013 | Doyle et al. | |
| 2003/0162331 A1* | 8/2003 | Tong | H01L 23/3171 438/132 |
| 2008/0157270 A1 | 7/2008 | Kim et al. | |
| 2008/0251886 A1 | 10/2008 | Kobayashi | |
| 2014/0145240 A1* | 5/2014 | Harrington, III | H01L 23/5258 257/139 |
| 2014/0239390 A1* | 8/2014 | Darwish | H01L 21/28202 257/339 |
| 2015/0002213 A1* | 1/2015 | Zhang | H01L 28/10 327/525 |
| 2016/0293589 A1 | 10/2016 | Zhang et al. | |
| 2017/0373368 A1* | 12/2017 | Srirattana | H01P 5/18 |
| 2018/0007796 A1 | 1/2018 | Browne et al. | |
| 2021/0066265 A1 | 3/2021 | Eid et al. | |

OTHER PUBLICATIONS

Non Final Office Action in U.S. Appl. No. 16/553,544 dated Sep. 29, 2020, 12 pages.
SF-0402FP075F-2 Bourns/Mouser Product Detail Sheet, retrieved from the Internet on Jul. 23, 2019, https://www.mouser.com/ProductDetail/Bourns/SF-0402FP075F-2?qs=sGAEpiMZZMtxU2g%2F1juGqWJziY9CkRY0vHzz7zQphOrkljLUi1w5ow%3D%3D.
Trimmer Capacitor Guide, EETech Media, LLC, 2019, retrieved from Internet on Jul. 1, 2019, http://www.capacitorguide.com/trimmer-capacitor.
Final Office Action in U.S. Appl. No. 16/553,544 dated Mar. 29, 2021, 16 pages.

* cited by examiner

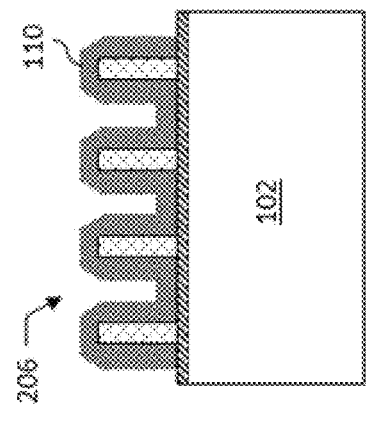
Fig. 3
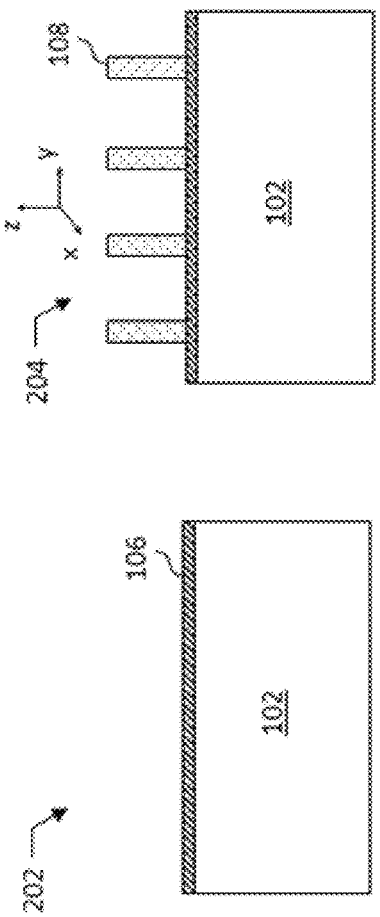
Fig. 2
Fig. 5
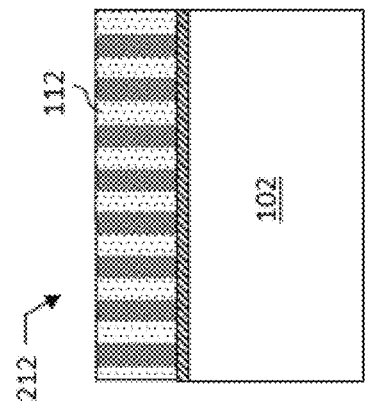
Fig. 4
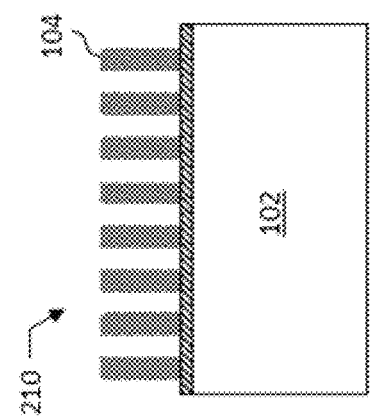
Fig. 6
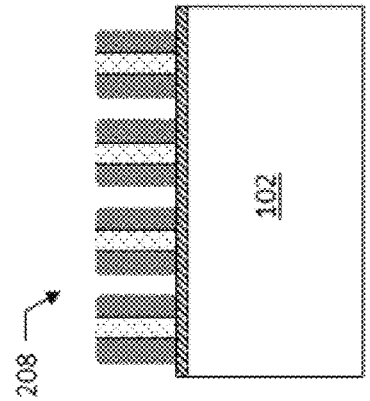
Fig. 7

US 11,011,481 B2

1

CONFIGURABLE RESISTOR

CROSS-REFERENCE TO RELATED APPLICATION

This application is a national stage application under 35 U.S.C. § 371 of PCT International Application Serial No. PCT/US2016/069084 filed on Dec. 29, 2016 and entitled "Configurable Resistor," which is hereby incorporated by reference herein in its entirety.

FIELD OF THE SPECIFICATION

This disclosure relates in general to the field of semiconductor devices, and more particularly, though not exclusively to, a system and method for a configurable resistor.

BACKGROUND

Semiconductor integrated circuits (ICs) are generally packed with large numbers of transistors, such as MOSFETs, to carry out their digital logic functions. ICs may also require other integrated elements, such as resistors, capacitor, and inductors. Rather than supplying these as discrete elements, these can often be provided on-chip via appropriate processing.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

FIGS. 2-7 are block diagrams of selected aspects of an integrated circuit at varying processing stages, according to one or more examples of the present specification.

2

Figure 16:
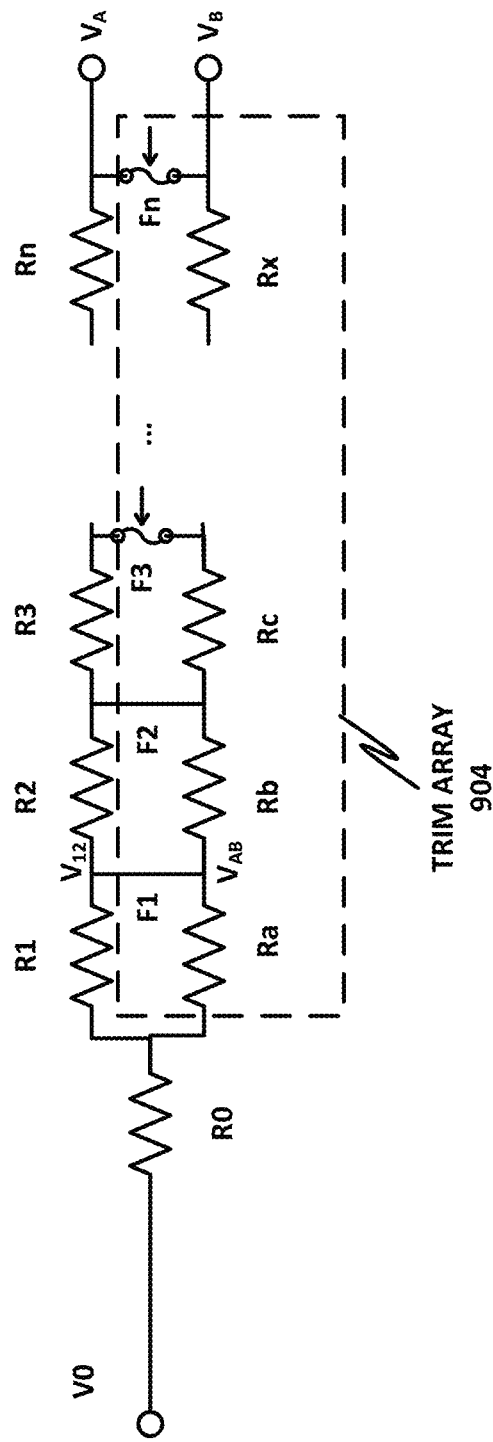

FIG. 16 is a schematic illustrating a configured resistive device according to one or more examples of the present specification.

Figure 17B:
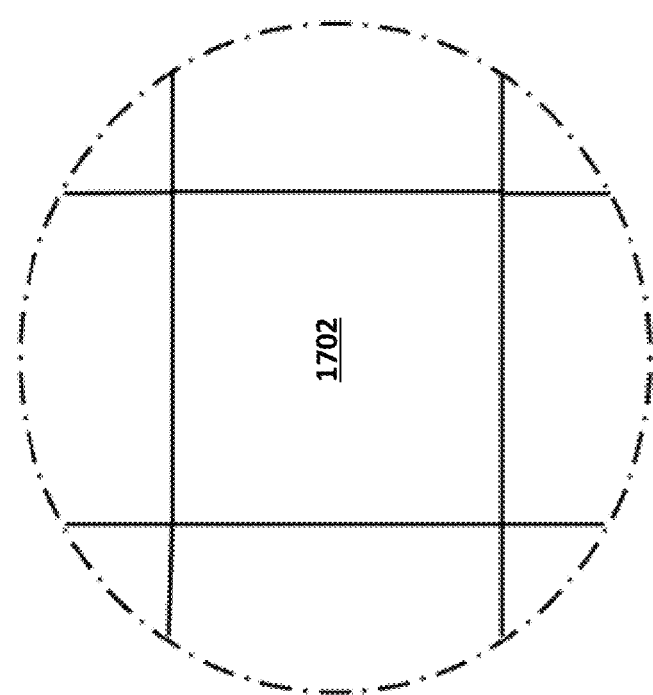
Figure 17A:
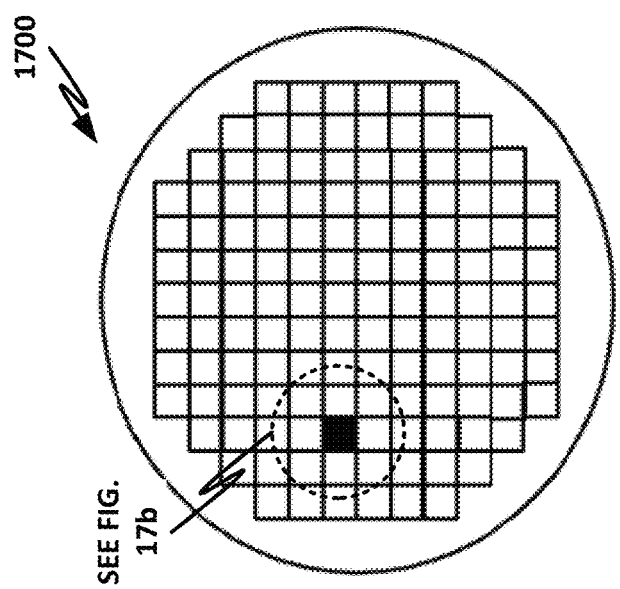

FIGS. 17a and 17b are top view of selected aspects of a semiconductor waver according to one or more examples of the present specification.

Figure 18:
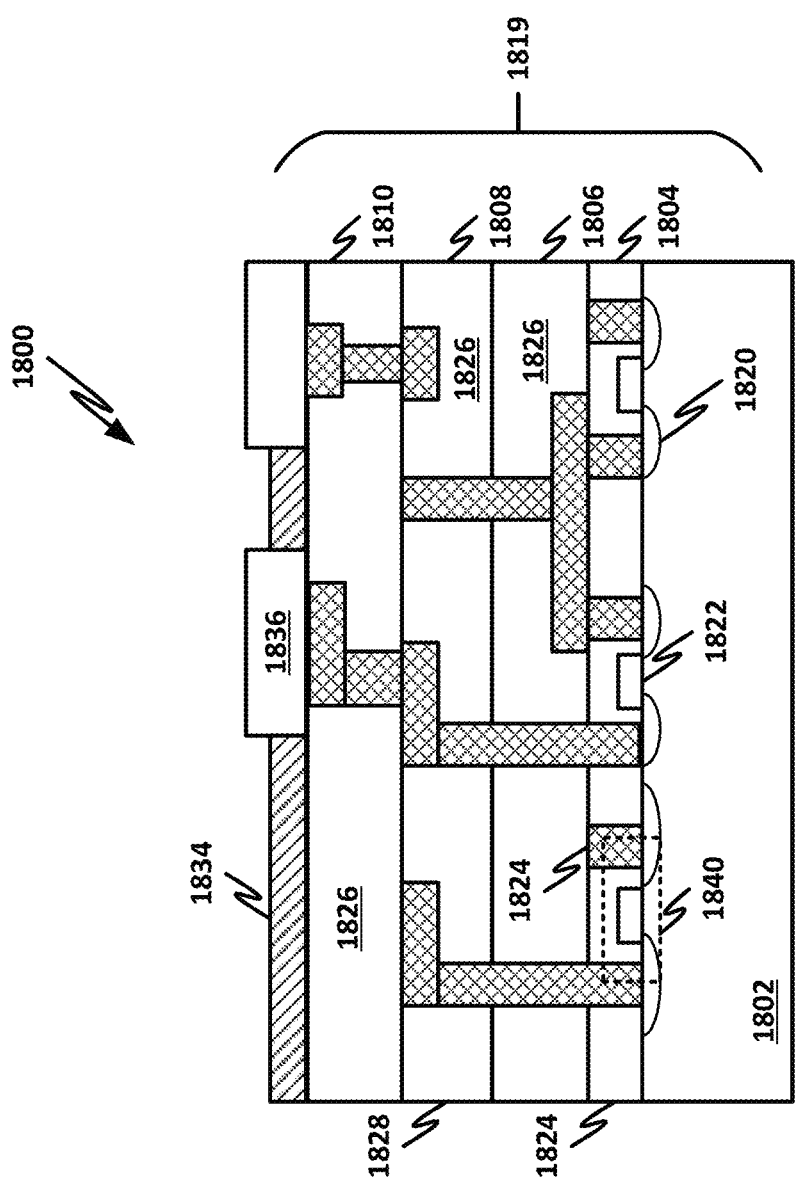

FIG. 18 is a cutaway side view of selected aspects of a semiconductor wafer according to one or more examples of the present specification.

Figure 19:
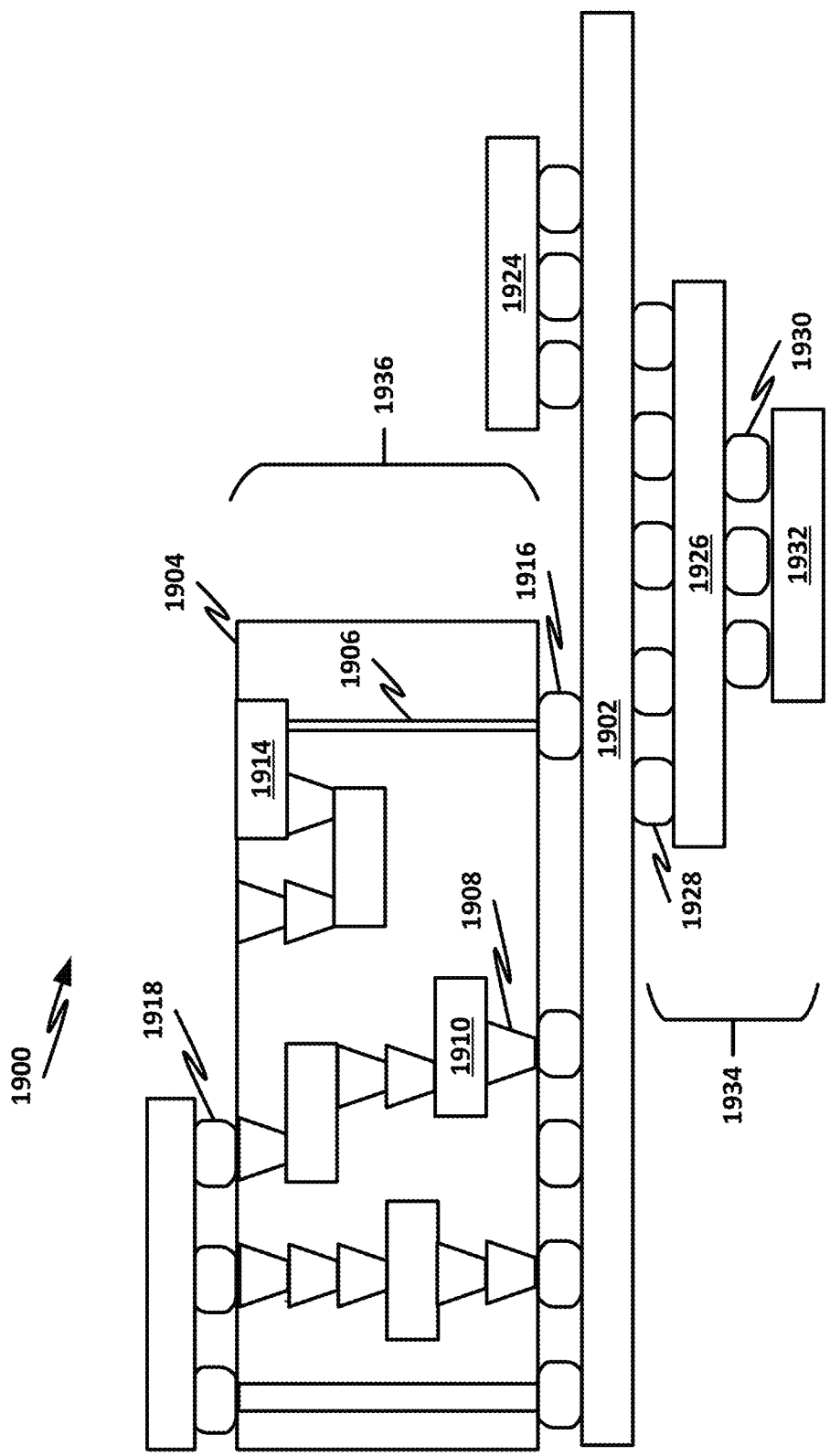

FIG. 19 is a cutaway side view of selected aspects of a circuit according to one or more examples of the present specification.

Figure 20:
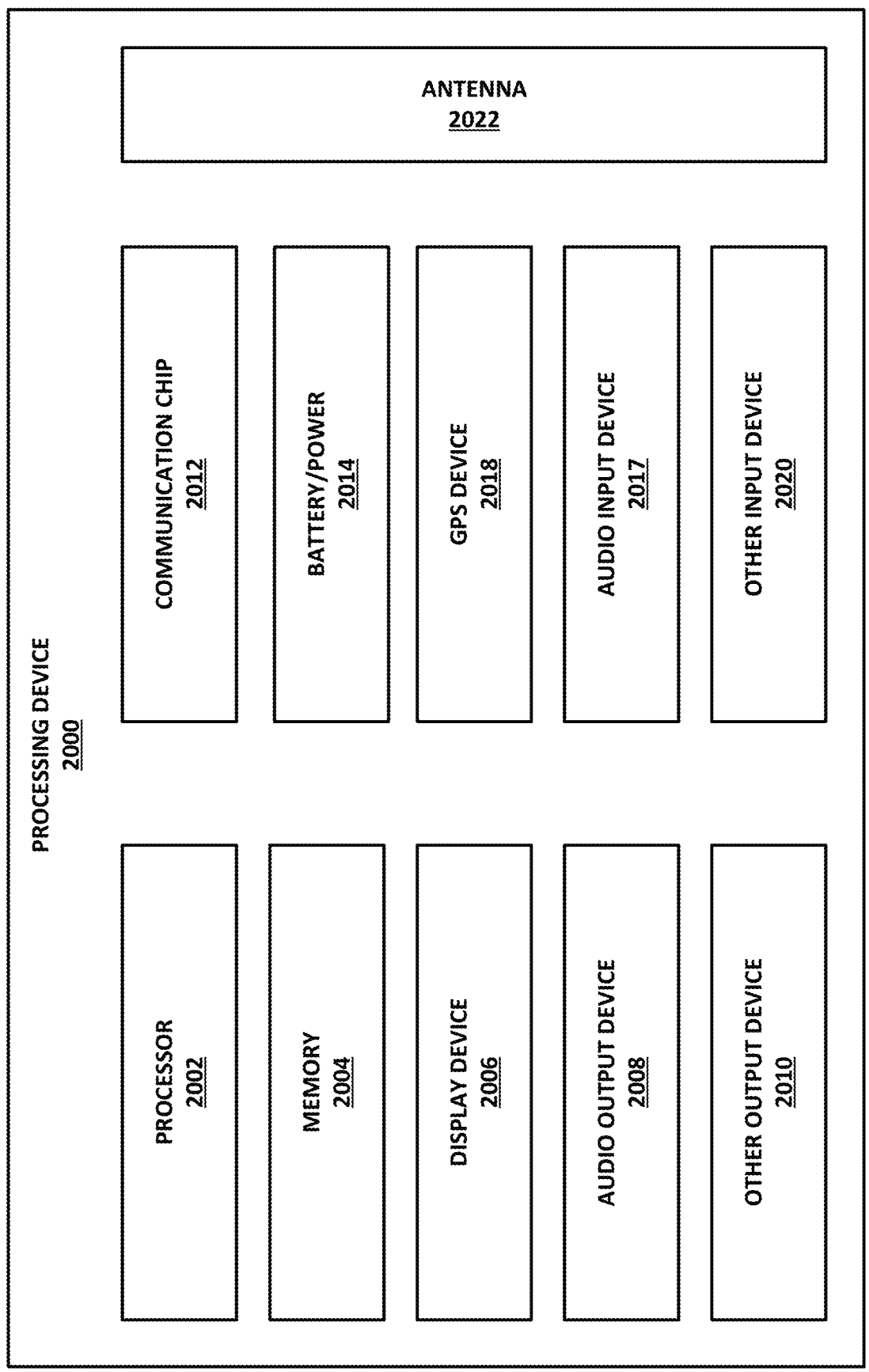

FIG. 20 is a block diagram of a computing system according to one or more examples of the present specification.

EMBODIMENTS OF THE DISCLOSURE

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiments may have different advantages, and no particular advantage is necessarily required of any embodiment.

Resistor precision and tolerance is an issue that is as old as purpose-built resistors themselves. An electrical engineering undergraduate will not get farther than his first lab class before he learns that "300Ω" actually means "300Ω±10%," or 5%, or 20%, or whatever the rating is. In the absence of the ideal materials, frictionless drive shafts, point masses, and spherical cows of physics textbooks, imprecision is an inevitable reality.

However, in particular in the context of semiconductor processing, hi-precision thin-film resistors may be critical to the success of a process. As feature sizes decrease, tolerances inevitably tighten, and resistor precision grows ever more important as "Moore's Law" marches forward. But process variations and real-world parameters make scalability of such high precision resistors difficult. Currently, ion-beam patterning may be used to trim resistors to a desired (nominal) value, or circuits may be designed to compensate for variability in resistance.

However, resistor tolerances can be tightened by structuring a thin-film resistor array with built-in "antifuses". Antifuses are structures that are initially non-conducting, but after application of enough voltage, they reach the dielectric breakdown property of their constituent material, and they begin conducting. Antifuses can be designed such that once they have broken down and begun conducting, the conductive path remains even after the stimulus voltage is removed.

The present specification describes a structure that is well-suited to semiconductor manufacturing of resistors, but that may also be adapted for use in discrete electronics, or for other impedance elements such as inductors or capacitors. In this case, an initial resistor "$R_0$" is formed, with a near-nominal resistance (or impedance). $R_0$ may then be "trimmed" by configuring a further resistor array, including a first series of resistors parallel to a second series of resistors. Each resistor in the first series is parallel to a corresponding resistor in the second series, and the two are separated by an antifuse. When a selected voltage is applied between the two resistor networks, some or all of the antifuses are "blown" (meaning that they begin conducting), thus forming shorts between a resistor and its parallel counterpart. By selecting the values of the resistors, and selecting which antifuses to blow, the resistor is trimmed so that its total resistance is made closer to the nominal value relative to $R_0$ alone.

Advantageously, the entire array needs only three inputs: a first terminal on the "input" side of $R_0$ (i.e., the side electrically removed from the trim array), and an input on each of the two resistor series. The trim voltage (used to blow the antifuses) is applied between these two latter inputs. After antifuses are blown, the resistance (or impedance) may be measured again, and additional trimming may be required by blowing additional antifuses, until the desired resistance is achieved. Once the trimming is complete, one of the leads on the "output" side can be used as the second lead for the resistor.

Further advantageously, if there is performance drift overtime, it may be possible to "re-trim" the resistor network to bring it back into compliance with the desired nominal resistance.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale.

A configurable resistor will now be described in more particular connection with the appended FIGURES.

In the following detailed description, various aspects of the illustrative implementations are described using terms commonly employed by those skilled in the art to convey the substance of their work to others skilled in the art. For example, as used herein, a "high-k dielectric" refers to a material having a higher dielectric constant than silicon oxide. In another example, a term "interconnect" is used to describe any element formed of an electrically conductive material for providing electrical connectivity to one or more components associated with an IC or/and between various such components. In general, the "interconnect" may refer to both trenches (also sometimes referred to as "lines") and vias. In general, a term "trench" is used to describe an electrically conductive element isolated by an interconnect support layer typically comprising an interlayer low-k dielectric that is provided within the plane of an IC chip. Such trenches are typically stacked into several levels. On the other hand, the term "via" is used to describe an electrically conductive element that interconnects two or more trenches of different levels. To that end, vias are provided substantially perpendicularly to the plane of an IC chip. A via may interconnect two trenches in adjacent levels or two trenches in not adjacent levels. A term "metallization stack" refers to a stack of one or more interconnects for providing connectivity to different circuit components of an IC chip.

Figure 1:
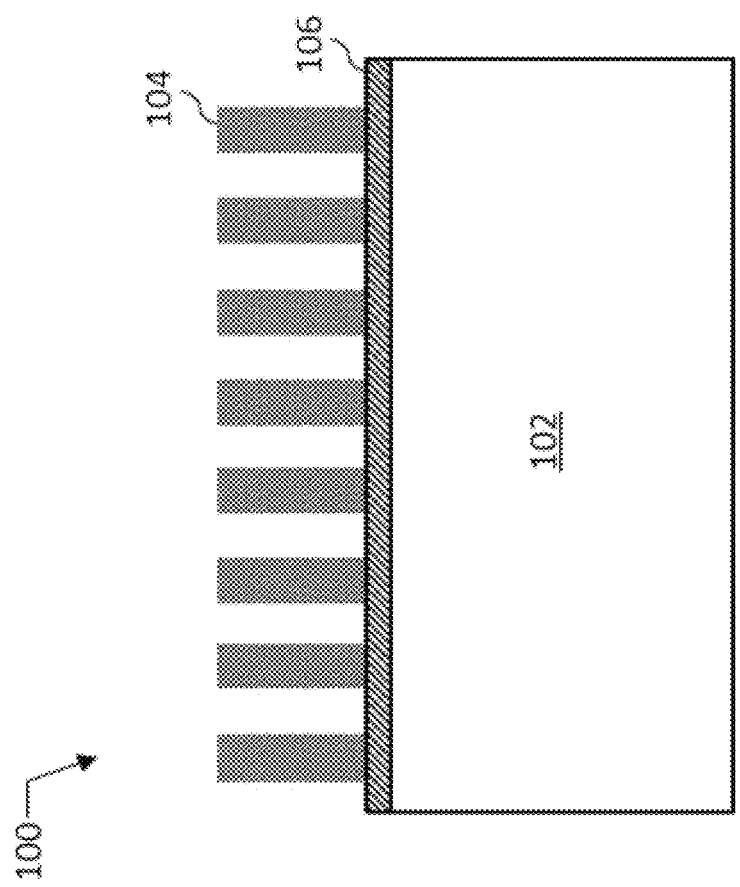
FIG. 1 is a block diagram of selected aspects of an integrated circuit, according to one or more examples of the present specification.

FIG. 1 is a cross-sectional side view of a metallization stack 100 including an interconnect support layer 102 housing a plurality of electrically conductive interconnects 104, in accordance with various embodiments. Only one interconnect 104 is labeled with a reference numeral in FIG. 1 for ease of illustration, but eight are illustrated in FIG. 1. Although eight interconnects 104 are illustrated in FIG. 1, this is also simply for ease of illustration, and more, or less, than eight interconnects 104 may be provided on the interconnect support layer 102 according to various embodiments of the present disclosure. Furthermore, note that the metallization stack 100 shown in FIG. 1, as well as structures illustrated in FIGS. 2-8A are intended to show relative arrangements of the components therein, and that various metallization stacks, or portions thereof, may include other components that are not illustrated (e.g., electrical contacts to the interconnects 104).

In general, implementations of the disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which a semiconductor device may be built falls within the spirit and scope of the present disclosure.

In various embodiments the interconnect support layer 102 may include any such substrate, possibly with some layers and/or devices already formed thereon, that provides a suitable surface for providing the interconnects 104 on. In the example shown in FIG. 1, an etch stop layer 106 is shown to be disposed over the interconnect support layer 102, which layer may serve to prevent or minimize etching into the underlying interconnect support layer 102 during fabrication of the interconnects 104 or any further components associated with an integrated circuit. However, presence of such a layer is entirely optional and embodiments of the present disclosure may be carried out on the interconnect support layer 102 within the etch stop layer 106 shown in FIGS. 1-8A. In other embodiments, other layers, not shown in the present FIGs, may be provided on at least some portions of the interconnect support layer 102 prior to the deposition of the interconnects 104, such as e.g. an insulating layer, such as an oxide isolation layer.

Furthermore, other materials or/and layers, not specifically shown in FIG. 1 may be provided over the interconnects 104 of the metallization stack. One such material is a dielectric material, e.g. including one or more interlayer dielectrics (ILD) layers, that may be deposited over the and in between the interconnects 104 of the metallization stack 100. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIGS. 2-7 illustrate various example stages in the manufacture of a metallization stack including a plurality of electrically conductive interconnects, such as e.g. the metallization stack 100 with the interconnects 104, in accordance with various embodiments. Although the particular manufacturing operations discussed below with reference to FIGS. 2-7 are illustrated as manufacturing a particular embodiment of the metallization stack 100, at least some of these operations and/or operations with minor modifications may be applied to manufacturing many different embodiments of the metallization stack 100, as discussed herein. Any of the elements discussed below with reference to FIGS. 2-7 may take the form of any of the embodiments of those elements discussed above or otherwise disclosed herein.

FIG. 2 illustrates a cross-sectional view of an assembly 202 including an interconnect support layer 102 and an etch stop layer 106 provided thereon. Discussions provided above with respect to the interconnect support layer 102 and the etch stop layer 106 are applicable here and, therefore, in the interests of brevity, are not repeated here.

FIG. 3 illustrates a cross-sectional view of an assembly 204 subsequent to providing a pattern of sacrificial elements 108 over the interconnect support layer 102 of the assembly 202 (FIG. 2). Only one sacrificial element 108 is labeled with a reference numeral in FIG. 3 for ease of illustration, but four are illustrated in FIG. 3. Although four sacrificial elements 108 are illustrated in FIG. 3, this is also simply for ease of illustration, and more, or less, than four sacrificial elements 108 may be provided on the interconnect support layer 102 according to various embodiments of the present disclosure.

In some embodiments, the pattern of sacrificial elements 108 may be a plurality of parallel lines having a height (i.e. the dimension in the z-direction of an exemplary reference coordinate system shown in FIG. 3) between 5 and 800 nanometers, including all values and ranges therein, and a width (i.e. the dimension in the y-direction of the exemplary reference coordinate system shown in FIG. 3) between 5 and 300 nanometers, including all values and ranges therein. In other embodiments, any other suitable pattern may be used, selected/designed so that, in subsequent fabrication steps, the electrically conductive material deposited on the sidewalls (i.e. the faces of the elements 108 which are substantially perpendicular to the interconnect support layer 102) of the sacrificial elements 108 will form appropriately shaped and appropriately located interconnects.

In some embodiments, the aspect ratio (i.e. a ratio of height to width) of the sacrificial elements 108 could be between 1 and 10, e.g. between 1 and 5 or between 1 and 3. The sacrificial elements 108 may be spaced by any suitable spacing that would allow depositing electrically conductive material of the desired thickness on the sidewalls of the sacrificial elements 108 so that the electrically conductive material on adjacent sidewalls of two adjacent elements 108 is not touching one another. For example, in some embodiments, the distance between different sacrificial elements 108 may be above 30 nanometers, e.g. above 50 nanometers.

In some embodiments, the sacrificial elements 108 may be formed of a non-metallic material. Since the sacrificial elements 108 will need to later be etched to leave the electrically conductive material deposited on their sidewalls, e.g. using anisotropic etching, etching properties of potential candidate materials are to be considered when selecting a suitable material to be used as the sacrificial elements 108. In addition, etching properties of a potential candidate material for the sacrificial elements 108 should are to be considered in view of a potential candidate electrically conductive material for forming the interconnects as described herein. Preferably the material for the sacrificial elements 108 and the electrically conductive material for the future interconnects 104 have sufficiently distinct etching properties so that etch of the sacrificial elements 108 will not affect, or will only have an adequately small effect, on the electrically conductive material (i.e. these two materials should have high etch selectivity with respect to one another). Besides appropriate etching characteristics, some other considerations in selecting a suitable material for the sacrificial elements 108 may include e.g. possibilities of smooth film formation, low shrinkage and outgassing, and good dielectric properties (such as e.g. low electrical leakage, suitable value of a dielectric constant, and thermal stability). Examples of materials that could be used to form the sacrificial elements 108 include, but are not limited to, silicon dioxide (SiO2), carbon doped oxide (CDO), silicon nitride, organic polymers such as perfluorocyclobutane, polytetrafluoroethylene or poly (methyl methacrylate) (PMMA), fluorosilicate glass (FSG), and organosilicates such as silsesquioxane, siloxane, or organosilicate glass.

In some embodiments, the sacrificial elements 108 may be provided over the interconnect support layer 102 using e.g. chemical vapor deposition or/and plasma-enhanced chemical vapor deposition, in combination with patterning (either before or after the deposition of the material of the sacrificial elements 108), as typically done in conventional processing. In some embodiments, patterning may include any patterning technique employing photoresist or other masks defining the dimensions and location of the sacrificial elements 108 over the interconnect support layer 102. In other embodiments, patterning may include any mask-less patterning technique, such as e.g. electron beam (e-beam) patterning.

FIG. 4 illustrates a cross-sectional view of an assembly 206 subsequent to conformally depositing a layer 110 of electrically conductive material on the sidewalls and in openings between the sacrificial elements 108 of the assembly 204 (FIG. 3). Conformal deposition generally refers to deposition of a certain coating (in this case, the electrically conductive material that will form the interconnects 104) on any exposed surface of a given structure (in this case, the interconnect support layer with the sacrificial elements 108 of the assembly 204), including on the sidewalls and bottom of any opening formed in/on the structure. A conformal coating may, therefore, be understood as a coating that is applied to exposed surfaces of a given structure, and not, for example, just to horizontal surfaces. In some embodiments, the coating may exhibit a variation in thickness of less than 35%, including all values and ranges from 1% to 35%, such as 10% or less, 15% or less, 20% of less, 25% or less, etc. The conformal coating process may be selected from processes such as e.g. chemical vapor deposition (CVD) or atomic layer deposition (ALD).

In various embodiments, a thickness of the layer 110, in particular the thickness of the layer 110 on the sidewalls of the sacrificial elements 108 (i.e. the dimension in the y-direction of an exemplary reference coordinate system shown in FIG. 3), may take on any suitable values so that, in subsequent fabrication steps, the electrically conductive material deposited on the sidewalls of the sacrificial elements 108 will form interconnects 104 of appropriate dimensions, the latter described in greater detail below.

In some embodiments, an annealing process may be carried out on the layer 110 after its deposition to improve the quality of the electrically conductive material for the future interconnects 104. In various embodiments, the electrically conductive material of the layer 110 may include one or more of aluminum, copper, tungsten, cobalt, ruthenium, nickel, iron, and molybdenum, and/or one or more alloys comprising aluminum, copper, tungsten, cobalt, ruthenium, manganese, magnesium, boron, phosphorus, nitrogen, carbon, and sulfur.

FIG. 5 illustrates a cross-sectional view of an assembly 208 subsequent to anisotropic etch of the layer 110 of the electrically conductive material deposited on the sidewalls and in the openings between the sacrificial elements 108 in the assembly 206 (FIG. 4). Any suitable anisotropic etching technique (i.e. etching uniformly in vertical direction) may be used to etch the electrically conductive material of the layer 110 so that the material is only left on the sidewalls, and possibly on top of, the sacrificial elements 108, but not in the openings between the sacrificial elements 108. Dry etching techniques, such as e.g. plasma etching, are typically known to provide finer resolution and directionality of etching than wet etching techniques which typically result in isotropic etching (i.e. etching in all directions). For example, the layer 110 made of metallic aluminum (Al) can be readily and anisotropically etched with chlorine (CCl) plasma by forming volatile Al2Cl6, where volatile Al2Cl6 is removed, resulting in patterned Al that remains only on the sidewalls, and possibly on top of, the sacrificial elements 108. A vertical anisotropic etch of the electrically conductive material of the layer 110 may be performed so that a portion of the electrically conductive material on the sidewalls of the sacrificial elements 108 is removed as well, which may advantageously decrease surface roughness of the electrically conductive material on the sidewalls of the sacrificial elements 108.

FIGS. 4 and 5 illustrate one exemplary embodiment for depositing an electrically conductive material on the sidewalls of the sacrificial elements 108. In other embodiments, other techniques may be used. For example, instead of a conformal deposition process shown in FIG. 4, other processes may be used that would deposit the electrically conductive material directly only, or substantially only, on the sidewalls of the sacrificial elements 108. Such alternative processed may e.g. include physical vapor deposition (PVD) processes such as, magnetron sputtering with a high re-sputter rate with no net deposition on horizontal surfaces and only sidewall deposition, evaporative deposition or e-beam deposition, and may directly result in the assembly 208 as shown in FIG. 5 without the need for the anisotropic etch described above. Considerations regarding a thickness of the electrically conductive material on the sidewalls of the sacrificial elements 108, as well as considerations regarding the selection and possible anneal of the electrically conductive material provided above are applicable to such alternative deposition processes and, therefore, in the interests of brevity, are not repeated here.

For any deposition technique used to deposit an electrically conductive material on the sidewalls of the sacrificial elements 108 described above, planarization of the assembly 208 may be subsequently performed, in order to expose the material of the sacrificial elements 108 for the subsequent etching of this material. Planarization may be performed using either wet or dry planarization processes. In one embodiment, planarization is performed using chemical mechanical planarization (CMP), which may be understood as a process that utilizes a polishing surface, an abrasive and a slurry to remove the overburden of the electrically conductive material which may cover upper surfaces of the sacrificial elements 108 to expose such surfaces for the subsequent etch.

FIG. 6 illustrates a cross-sectional view of an assembly 210 subsequent to the removal of the sacrificial elements 108 from between the electrically conductive material deposited on the sidewalls of the sacrificial elements 108 in the assembly 208 (FIG. 5). In some embodiments, such a removal may include anisotropic etch to vertically etch away the material of the sacrificial elements 108. Etchants used in this etch would be different from those described above for etching the electrically conductive material, because this time, preferably, the electrically conductive material would not be etched. Any substance suitable for anisotropically etching the sacrificial elements 108 may be used in forming the assembly 210.

Removal of the sacrificial elements 108 results in forming a pattern of electrically conductive elements, as e.g. shown in the assembly 210, which form a plurality of interconnects 104. In fact, the assembly 210 shown in FIG. 6 is substantially the same as the metallization stack 100 shown in FIG. 1. In various embodiments, an average width of each interconnect 104 may be between 5 and 30 nanometers, while an average height of each interconnect may be between 5 and 800 nanometers.

FIG. 7 illustrates a cross-sectional view of an assembly 212 subsequent to filling the spaces between the interconnects 104 of the assembly 210 (FIG. 6) with a suitable dielectric material 112, such as e.g. any of the ILD materials described herein. In some embodiments, the dielectric material 112 may be provided into the spaces between the interconnects 104 using e.g. CVD and/or plasma-enhanced CVD, as typically done in conventional processing. In still other embodiments, the dielectric material 112 may include a dielectric material formed in the spaces between the interconnects 104 using coating techniques involving cross-linking of liquid precursors into solid dielectric materials.

In some embodiments, some or all of the surfaces of the interconnects 104 of the assembly 210 may be cleaned or treated prior to applying the dielectric 112, e.g. to reduce surface contamination, minimize interface traps, promote adhesion, and/or decrease interdiffusion of materials.

For example, the surfaces of the interconnects 104 may be cleaned using chemical or plasma clean, or applying heat in a controlled environment.

In some embodiments, an "interface layer" may be applied between on the interconnects 104 of the assembly 210, in particular on the sidewalls of the interconnects 104, to prevent, decrease, or minimize spontaneous and uncontrolled formation of other interfacial layers.

In some embodiments, an adhesion promoter or adhesion layer may be applied prior to application of the dielectric 112, in order to promote adhesion between the electrically conductive material of the interconnects 104 and the material(s) of the dielectric 112 filling the space between the interconnects 104. Example materials which could be used to form an adhesion layer between the electrically conductive material of the interconnects and the dielectric 112 include, but are not limited to molecular species such as self-assembled monolayers (SAMs). These molecules typically include a head group, an alkane chain, and an end group. The head group could be a thiol or nitrile which forms a bond with the conductive material. The end group could be an amine, silane, ethoxy silane, chloro silane or amino silane which forms bonds with the dielectric.

In some embodiments, before filling in spaces between the interconnects 104 of the assembly 210 with the dielectric material, a diffusion barrier layer may be conformally deposited, using any suitable conformal deposition techniques as described herein, on the sidewalls of at least some, preferably all, of the interconnects 104, for preventing diffusion of the electrically conductive material of the interconnects 104 out of these elements and into the surrounding dielectric material 112. In various embodiments, a diffusion barrier layer may be electrically conductive, semiconducting, or dielectric. Examples of materials that could be used for the diffusion barrier layer include, but are not limited to, one or more of tantalum (Ta), tantalum nitride (TaN), titanium (Ti), titanium nitride (TiN), ruthenium (Ru), cobalt (Co), silicon nitride (SiN), silicon carbide (SiC), silicon dioxide (SiO2), aluminum oxide (Al2O3), and the like.

In further embodiments, the method may further include providing a barrier-dielectric adhesion layer on sidewalls of at least some of the interconnects 104 covered with a diffusion barrier layer, in order to promote adhesion between the material of the diffusion barrier layer and the material(s) of the dielectric 112 that will fill the space between the interconnects 104. Example materials which could be used to form a barrier-dielectric adhesion layer include, but are not limited to, tantalum, titanium, titanium nitride, tantalum nitride, tungsten nitride, molybdenum nitride, and the like.

After filling in spaces between the electrically conductive elements 104 with the dielectric material 112, optionally, planarization may be performed again, e.g. using any of the planarization techniques described above, to expose the upper surfaces of the interconnects 104 so that the interconnects 104 may be electrically connected to further circuit elements (not specifically shown in FIG. 7).

Fabricating the interconnects 104 by depositing the electrically conductive material of the interconnects 104, typically a metal, in a spacer-like fashion (i.e. as a "spacer" around the sacrificial elements 108), followed by the removal of the sacrificial elements 108, as described above, justifies the name "subtractive metal spacer based deposition" given to the methods of fabricating interconnects described herein. Implementing these methods may allow realizing several advantages, in particular when compared to conventional methods of providing interconnects by, first, depositing a layer of metal, and then patterning the metal to form interconnects of desired shapes and in desired patterns.

One advantage is that the methods described herein do not obscure alignment and metrology marks in the frame of the die during deposition of interconnects.

Another advantage relates to the resulting interconnects having decreased surface roughness on their sidewalls compared to what could be achieved using prior art fabrication methods. In some embodiments, a width of an individual interconnect (i.e. the dimension in the y-direction of the exemplary reference system shown in the FIGS.) formed using the methods described herein, e.g. of an individual interconnect 104, along a height of that interconnect may vary by less than 10 percent, preferably less than 5%, e.g. less than 3 or 2%, of an average width of the interconnect along the height of the interconnect. Having a width of an interconnect varying by less than a certain, relatively small, amount compared to the average width along the height of the interconnect indicates that the sidewalls of the interconnect have relatively low surface roughness. Such relatively slow surface roughness may be advantageously achieved using the methods of forming electrically conductive interconnects as described herein and was not possible to achieve using prior art fabrication techniques.

Metallization stacks as descried herein may be particularly advantageous when used in the metal layers of a microprocessor device for analog circuitry, logic circuitry, or memory circuitry, and may be formed along with existing complementary metal oxide semiconductor (CMOS) processes.

Figure 8:
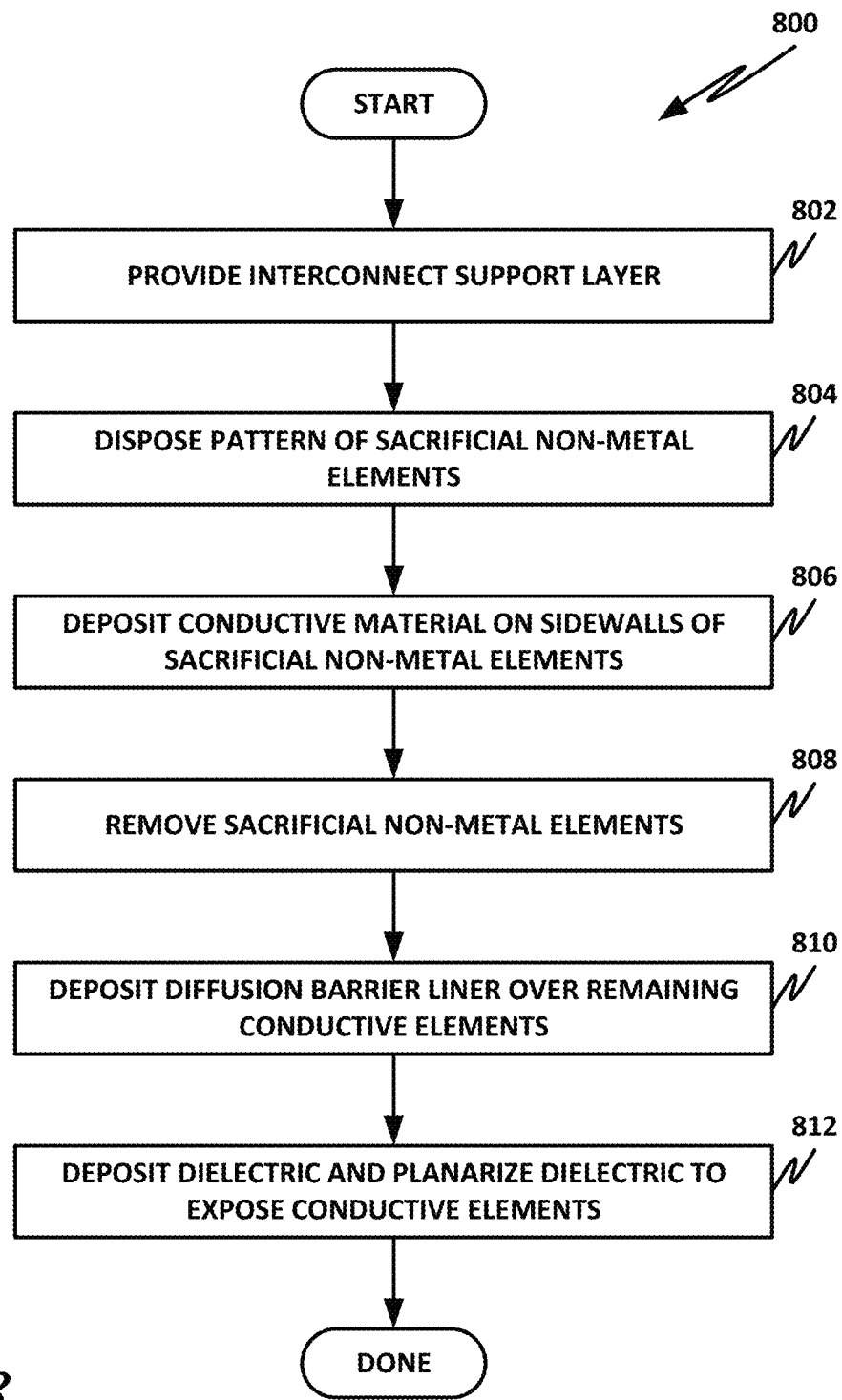
FIG. 8 is a flow chart of a semiconductor manufacturing process according to one or more examples of the present specification.

FIG. 8 is a flow diagram of an example method 800 of manufacturing a metallization stack (e.g. the metallization stack 100 including a plurality of electrically conductive interconnects 104), summarizing the subtractive metal spacer based deposition described herein, in accordance with various embodiments. Although the operations of the method 800 are illustrated once each and in a particular order, the operations may be performed in any suitable order and repeated as desired. For example, one or more operations may be performed in parallel to manufacture multiple patterns of interconnects substantially simultaneously. In another example, planarization operations may be performed in a different order, as needed.

At 802, an interconnect support layer may be provided. The interconnect support layer provided at 802 may take the form of any of the embodiments of the interconnect support layer 102 disclosed herein, for example (e.g., any of the embodiments discussed herein with reference to the metallization stack 100 or any of the assemblies shown in FIGS. 2-7).

At 804, a pattern of sacrificial non-metal elements may be provided. The sacrificial non-metal elements provided at 804 may take the form of, and be provided according to, any of the embodiments of the sacrificial elements 108 disclosed herein, for example. In some embodiments, the sacrificial elements may be provided at 804 so as to be in contact with the interconnect support layer of 802. In other embodiments, an intermediate material may be disposed between the interconnect support layer and the sacrificial elements, e.g. an etch stop layer or an insulating layer.

At 806, electrically conductive material, e.g. a metal, may be provided on the sidewalls of the sacrificial elements. The electrically conductive material provided at 806 on the sidewalls of the sacrificial elements may take the form of, and be provided according to, any of the embodiments disclosed herein.

At 808, the sacrificial elements may be removed from between the electrically conductive material provided on their sidewalls. Removal of the sacrificial elements at 808 may be performed according to any of the embodiments disclosed herein.

At optional process 810, a diffusion barrier liner may be deposited over the electrically conductive elements remaining after the removal of the sacrificial elements at 808. The diffusion barrier liner provided at 810 may take the form of, and be provided according to, any of the embodiments of the diffusion barrier liner disclosed herein.

At optional process 812, a dielectric material, e.g. an ILD, may be deposited between, and possibly over, the electrically conductive elements remaining after the removal of the sacrificial elements at 808. The dielectric material may, optionally, be planarized to expose the upper surfaces of the electrically conductive elements from the surrounding dielectric. The dielectric material provided at 812, as well as the planarization thereof, may take the form of, and be provided and/or planarized according to, any of the embodiments of the dielectric material 112 disclosed herein.

The method 800 may further include other manufacturing operations related to fabrication of other components of a metallization stack 100 or any devices that include such a stack. For example, the method 800 may various cleaning operations, and/or operations for incorporating the metallization stack 100 in, or with, an IC component.

Figure 9:
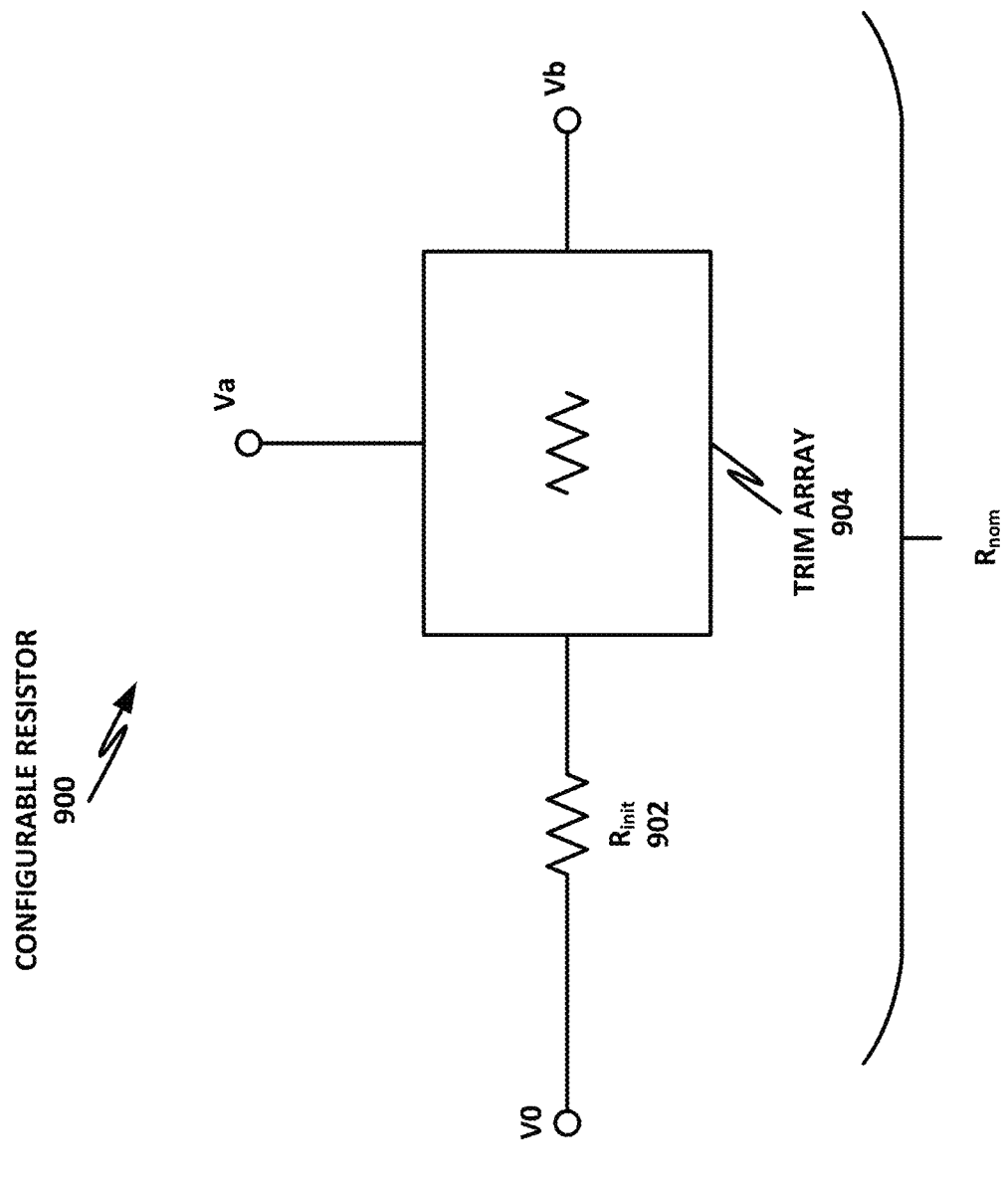
FIG. 9 is a block diagram of a resistive element according to one or more examples of the present specification.

FIG. 9 is a flowchart illustrating a high-level operating principle of a configurable resistor 900 according to one or more examples of the present specification.

In this example, an input voltage V0 is supplied, as well as voltages Va and Vb. It should be noted here that the terms "input" and "output" voltages are used as convenient references only, and are not intended to infer that configurable resistor 900 of the present specification is limited to one directional electrical flow, or otherwise acts like a diode.

In this case, configurable resistor 900 has a nominal resistance $R_{nom}$, which is the desired or nominal total resistance of the network. It is anticipated that the initial measured resistance ($R_{init}$) may not adequately match $R_{nom}$. Thus, a trim array 904 may be used to trim the resistance value and configure configurable resistor 900 to have the desired nominal resistance.

Figure 10:
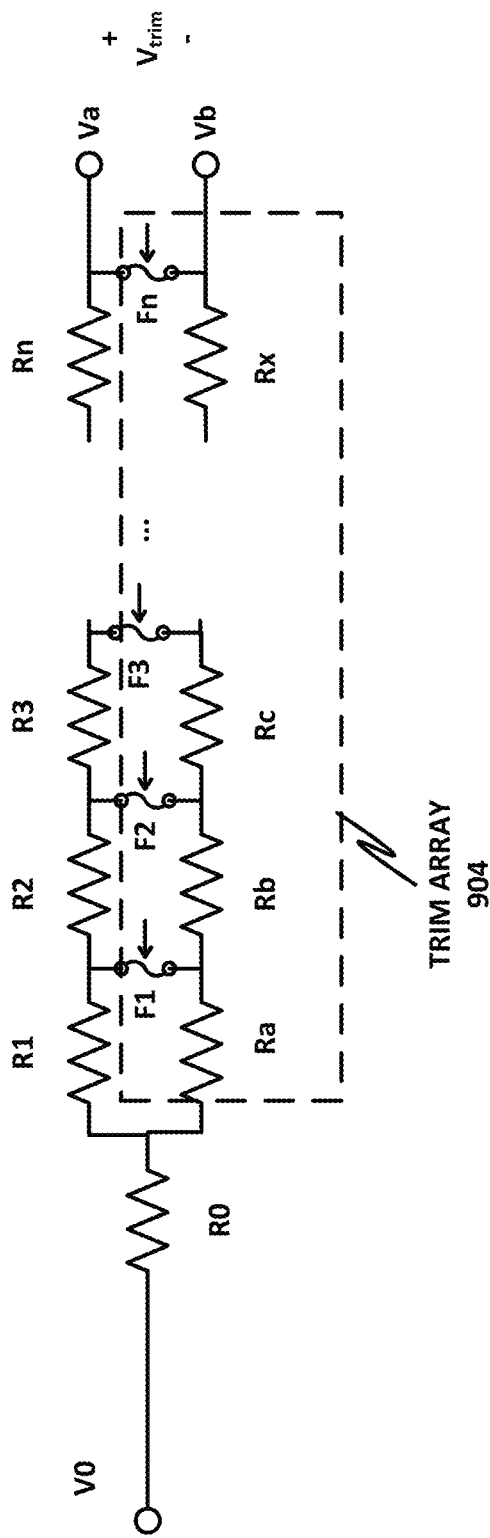
FIG. 10 is an electrical schematic of a resistive network according to one or more examples of the present specification.

FIG. 10 is an example electrical schematic illustrating an embodiment of how this is achieved.

In this case, the path between the V0 and Va includes a series of resistors R0, R1, R2, R3, up through Rn. Thus, the initial resistance between V0 and Va is provided by these resistors in series (R0+R1+R2+R3+ . . . Rn). Initially, this series of resistors may be configured so that $R_{init}$ is close $R_{nom}$, but slightly larger. This resistance may be may need to be trimmed by trim array 904 to further conform the resistance to the desired nominal resistance.

This can be accomplished by adding some or all of resistors Ra, Rb, Rc, up through Rx, which will create parallel resistances. Adding a parallel resistor will decrease the resistive effect of its corresponding series resistor, according to the well-known relationship $$\frac{1}{R_{total}} = \frac{1}{R1} + \frac{1}{R2}.$$

Thus, adding any or all of the resistors in trim array 904 will trim down the total resistance.

These resistors can be added by blowing anti-fuses F1, F2, F3, up through Fn. Once these anti-fuses are blown, a short develops between each series resistor and its corresponding resistor in trim array 904. In other words, the corresponding resistor for R1 is Ra. When antifuse F1 is "blown," there is a short between the terminals of R1 and Ra, and thus Ra is incorporated into the resistive network in parallel to R1, thus decreasing the series resistance of R1, and trimming down the total resistance of the circuit. Similarly, if F2 is blown, then the combination R2∥Rb will be smaller than the individual resistor R2. As more anti-fuses are blown, the resistance can be further trimmed down.

In one embodiment, the values of the resistors may be selected so that a potential difference $V_{trim}$ applied between Va and Vb will blow a predictable set of fuses. For example, the resistances may be selected so that when $V_{trim}$ is applied, the highest potential difference will be between resistors R1 and Ra. The next highest potential difference will be between R2 and Rb. The next highest potential difference will be between R3 and Rc, and so on down to the lowest potential differences between Rn and Rx. This is accomplished by selecting Ra>Rb>Rc> . . . Rx.

Thus, the value of the trim can be selected to blow only those fuses that are desired to be blown. For example, a $V_{trim}$ may be selected to blow only anti-fuses F1 and F2. This will create electrical shorts in these networks, thus reducing the series resistances R1 and R2, but leaving unchanged the series resistances of R3 through Rn. If further trimming is required, then a $V_{trim}$ may be applied to also blow antifuse F3, but not the other fuses.

Note that while $V_{trim}$ is applied, V0 may remain unconnected so that stray power is not directed to other parts of the circuit.

The configuration in FIG. 10 may be used either for an integrated circuit, or for a discrete electrical device. Thus, the circuit of FIG. 10 may be adapted just as easily to manufacturing a discrete resistor for placement on a printed circuit board.

Also note that the arrangement of resistors in FIG. 10 may be replaced by an arrangement of other impedance elements, including non-linear or reactive elements, such as inductors or transistors. If the resistors of the array were replaced with capacitors, a similar circuit could be constructed wherein C1 . . . Cn are parallel to C0, and wherein anti-fuses are placed for corresponding trim capacitors in series with each of the foregoing.

Figure 11:
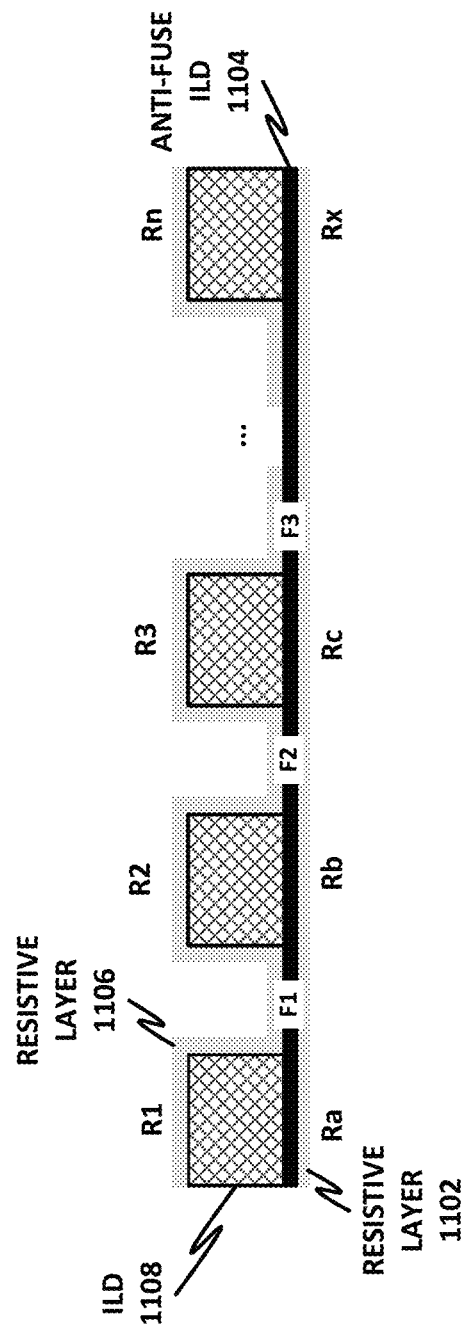
FIG. 11 is a cutaway side view of a semiconductor resistor device according to one or more examples of the present specification.

FIG. 11 is a cutaway side view of selected portions of an integrated circuit according to one or more examples of the present specification. Note that this view shows only selected layers of the integrated circuit, and that many other layers may be present.

In this case, a thin-film resistive layer 1102 may first be deposited on a substrate. This may be a metallic conductor, such as NiCr for example, and may be deposited by means such as vapor deposition or vacuum deposition.

Above resistive layer 1102 there is an antifuse interlayer dielectric (ILD) 1104. Antifuse ILD 1104 may be selected to provide the desired antifuse properties, and to have a thickness such that its breakdown voltage is within a desired or selected parameter. In some examples, antifuse ILD 1104 may have the property that its breakdown voltage per thickness is approximately 1V per nanometer. Thus, if the desired breakdown voltage is approximately 5V, then the thickness of antifuse ILD 1104 may be approximately 5 nm.

Note that in certain cases, selecting the breakdown voltage of the anti-fuses may be done in different ways. For example, the resistors may be configured so that the largest voltage drop happens across resistor Ra, as described above, so that as higher $V_{trim}$ is applied, more antifuses break down. In another embodiment, the thickness of antifuse ILD 1104 may be varied for each antifuse, such that each antifuse has a different breakdown voltage. In that case, the trim resistors could be of uniform resistance, so that the voltage drop across each is the same, and the applied voltage may be selected to breakdown only the desired antifuses.

Figure 12:
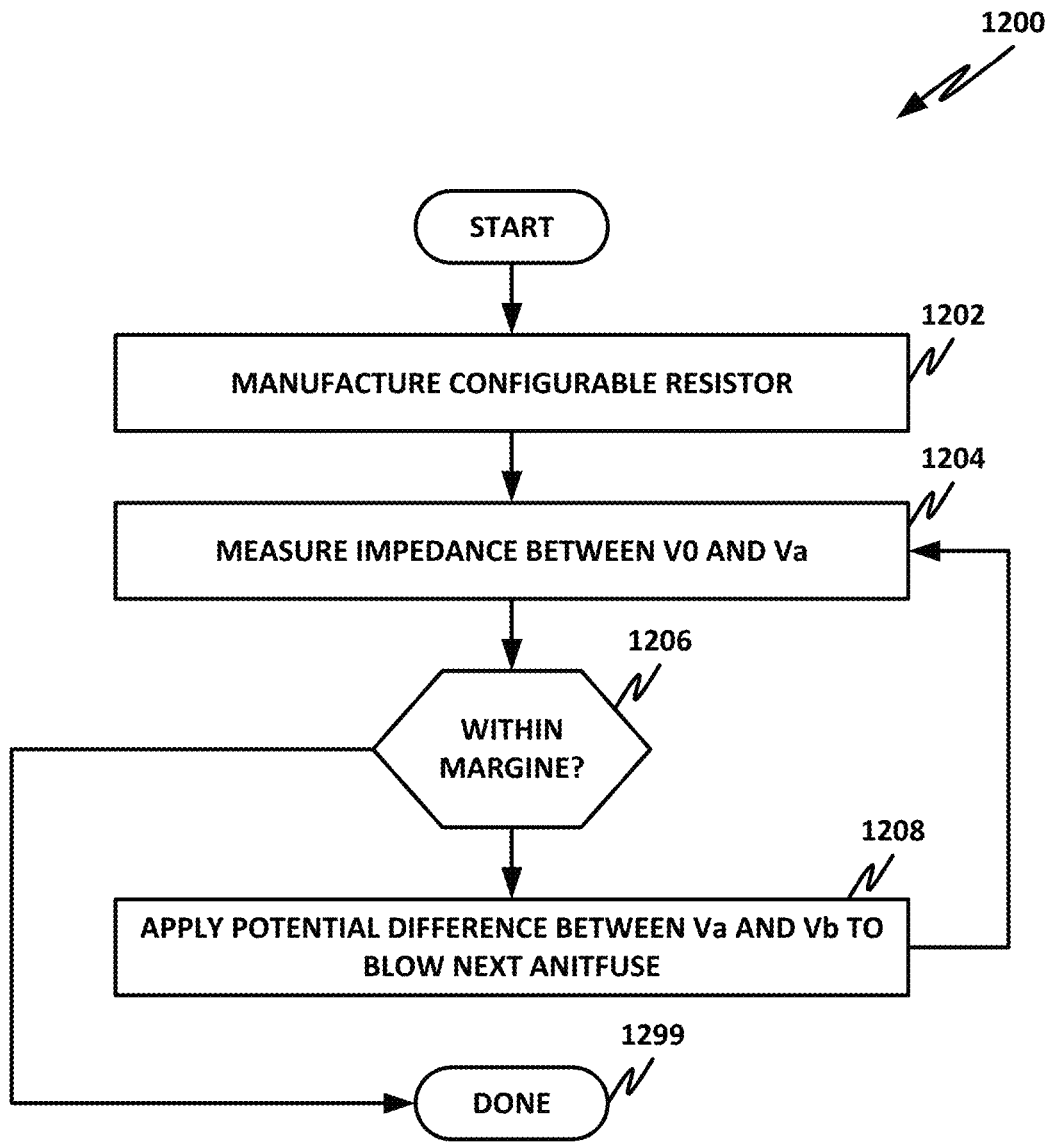
FIG. 12 is a flow chart of a method of configuring a resistive device according to one or more examples of the present specification.

FIG. 12 is a flowchart of a method 1200 of configuring a configurable resistor 900 according to one or more examples of the present specification.

In block 1202, the configurable resistor is manufactured, either as a discrete resistor, or as a an element on an integrated circuit, as described herein.

In 1204, the initial impedance or resistance $R_{init}$ is measured between V0 and Va.

In decision block 1206, it is determined whether the measured resistance is within a desirable margin of $R_{nom}$. If the resistance is within margin, then in block 1299, the method is done.

Returning to block 1206, if the voltage is not within margin, then in block 1208, a trim voltage $V_{trim}$ is selected for applying between Va and Vb to blow the desired antifuses to achieve the desired trim.

Control may then flow back to block 1204, where the impedance is measured again, and the process of blowing antifuses and measuring the resistance is repeated until the measured resistance is within margin, and in block 1299, the method is done.

Figure 13:
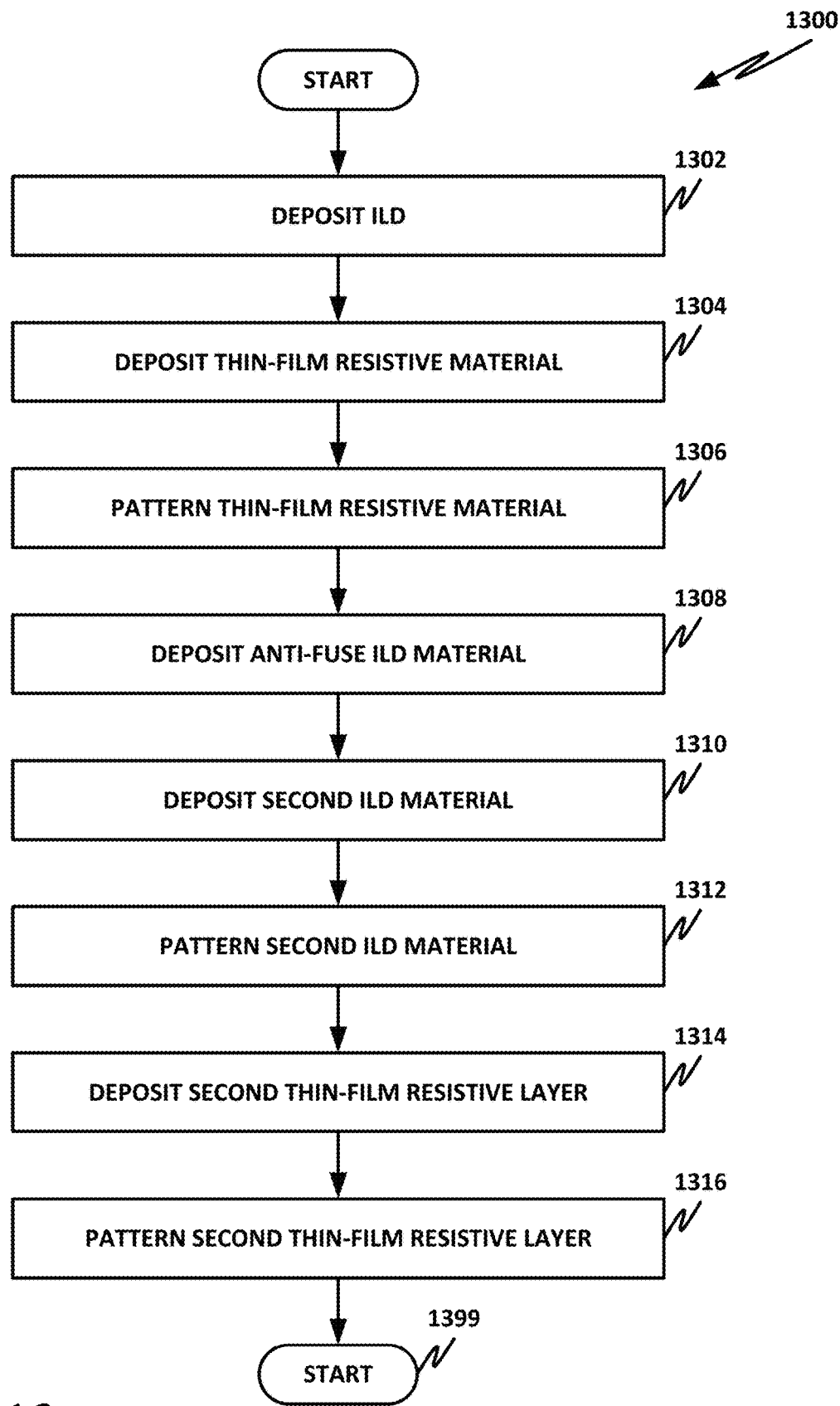
FIG. 13 is a flow chart of a method of manufacturing a resistive device according to one or more examples of the present specification.
Figure 14:
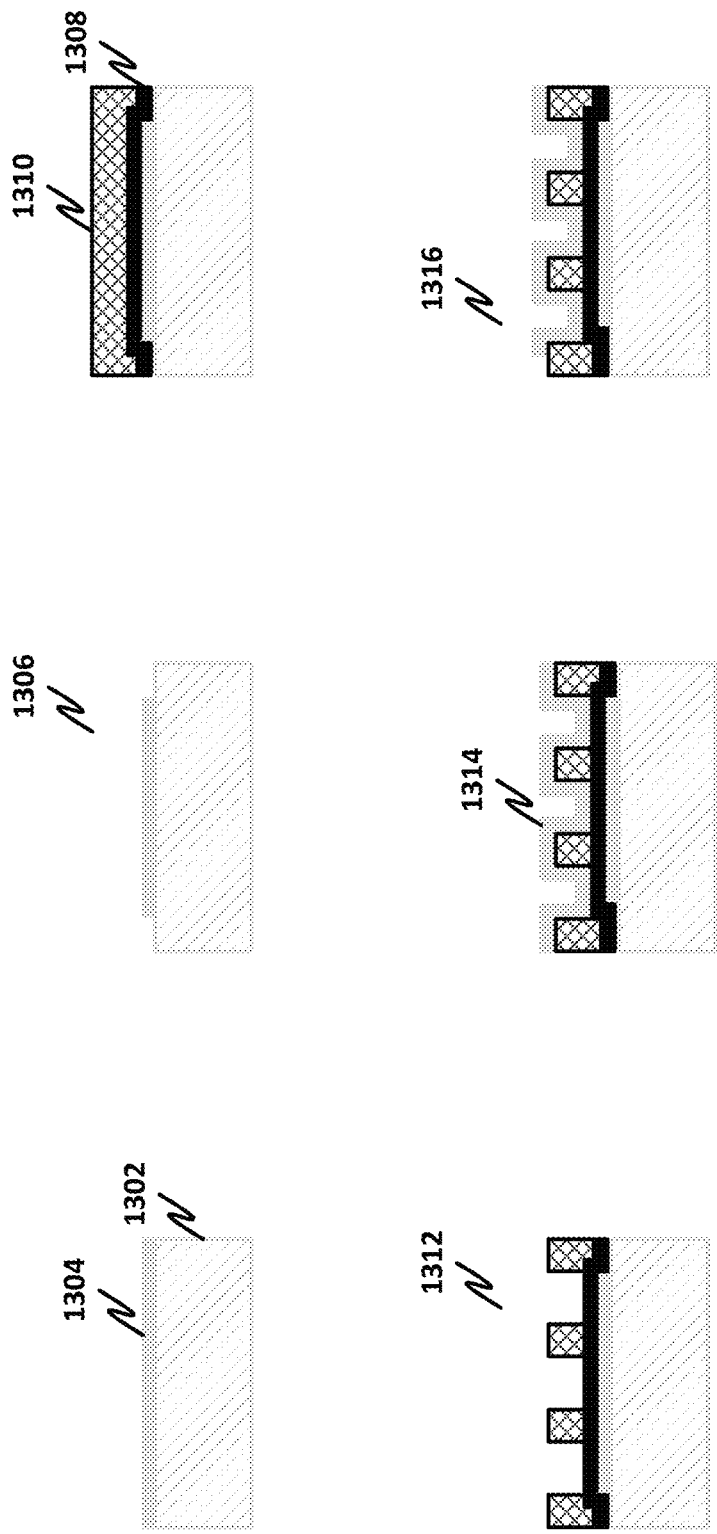
FIG. 14 is a block diagram illustration of the method of FIG. 13 according to one or more examples of the present specification.

FIG. 13 is a flowchart of a method 1300 of manufacturing an integrated circuit with a configurable resistor according to one or more examples of the present specification. Note that some of the operations in FIG. 13 correspond to some of the operations in FIG. 8. Thus, additional details of many of these operations can be found by referring to FIG. 8. FIG. 14 is a cutaway side view of various stages of the manufacturing process, which corresponds to method 1300.

In block 1302, the interlayer dielectric is deposited.

In block 1304, a thin-film resistive material is deposited. This thin-film resistive material may be any materials discussed herein, and may be selected to provide the desired resistive properties.

In block 1306, the thin-film resistive material is patterned according to known methods. This layer may form the network of trim resistors 904, as illustrated in FIG. 10.

In block 1308, the antifuse ILD material is deposited over the thin-film resistive material. The thickness of the antifuse ILD material may be selected to provide the desired properties, including the desired breakdown voltage for "blowing" the antifuses. In one embodiment, the antifuse ILD material is of substantially uniform thickness. In another embodiment, the thickness varies so that each antifuse has a different breakdown voltage.

While it is possible to use a standard ILD material to fabricate an antifuse, it is also possible to use novel materials to reduce voltage requirements for antifuse operation.

For example, nanoparticles may align and sinter together with the application of voltage to change their electrical conductivity.

In another example, organic conducting polymers with a voltage-activated dopant may be used. The application of a voltage either moves the dopant to change the electrical properties of the polymer or ionizes a dopant for movement through an electric field.

In yet another example, additives to spin-on dielectrics, such as conductive nanoparticles in a porous ILD, may facilitate breakdown behavior in ILDs.

In block 1310, a second ILD material is deposited.

In block 1312, the second ILD material is patterned.

In 1314, the second thin-film resistive layer is deposited.

In block 1316, the second thin-film resistive layer is patterned, such as to ensure that the right number of resistors is provided. This second thin-film resistive layer may form the initial resistive series, as illustrated in FIG. 10.

In block 1399, the method is done.

Note that the above is only one example configuration. There are alternate implementations of the circuit topography. For example, a single thin film resistor layer may be used, where both V12 and Vab (See FIG. 16) are connected to the antifuse through a network of interconnects or vias. The anti-fuse and thin-film resistors need not be co-planar.

Figure 15:
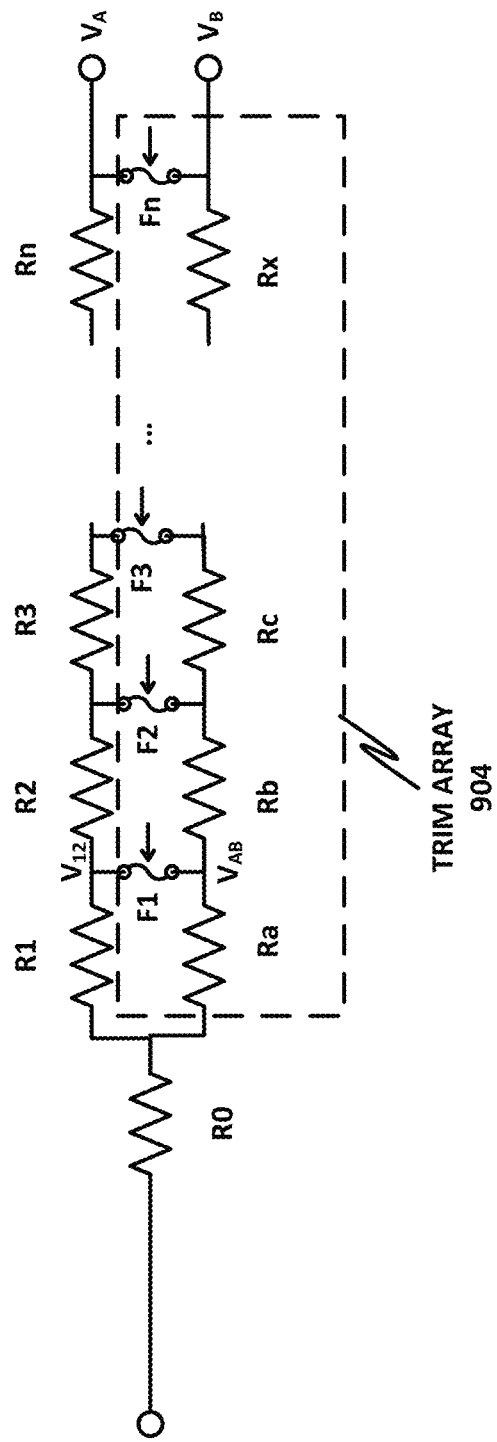
FIG. 15 is a schematic illustrating a method of configuring a resistive device according to one or more examples of the present specification.

FIGS. 15 and 16 illustrate an example final configuration. In FIG. 15, configurable resistor 900 is shown with none of its antifuses blown. In this configuration, the total resistance experience between V0 and Va may be more than the desired nominal resistance. Thus, it is desirable to add some of the trim resistors in parallel with the series resistors to reduce their values. In this case, anti-fuses F1 and F2 are selected to be blown. As illustrated in FIG. 16, antifuses F1 and F2 are blown, so that shorts are now defined between V12 and Vab, and V23 and Vbc. Thus, the value of R1∥Ra is less than the value of R1 by itself, and the value of R2∥Rb is less than the value of R2 by itself. Because antifuses F3 through Fn are not blown, resistors Rc through Rx are not included in the resistive network. Thus, the total resistance between V0 and the VA is closer to the nominal resistance of configurable resistor 900 compared to the value of the initial resistive string.

The metallization stacks disclosed herein may be included in any suitable electronic device. FIGS. 17-20 illustrate various examples of apparatuses that may include one or more of the metallization stacks disclosed herein.

FIGS. 17A and 17B are top views of a wafer 1700 and dies 1702 that may include one or more metallization stacks in accordance with any of the embodiments disclosed herein. The wafer 1700 may be composed of semiconductor material and may include one or more dies 1702 having IC structures formed on a surface of the wafer 1700. Each of the dies 1702 may be a repeating unit of a semiconductor product that includes any suitable IC (e.g., ICs including one or more components that include one or more metallization stacks 100). After the fabrication of the semiconductor product is complete (e.g., after manufacture of a metallization stack 100 in a particular electronic component, e.g. in a transistor or in a memory device), the wafer 1700 may undergo a singulation process in which each of the dies 1702 is separated from one another to provide discrete "chips" of the semiconductor product. In particular, devices that include a metallization stack as disclosed herein may take the form of the wafer 1700 (e.g., not singulated) or the form of the die 1702 (e.g., singulated). The die 1702 may include one or more transistors (e.g., one or more of the transistors 1840 of FIG. 18, discussed below) and/or supporting circuitry to route electrical signals to the transistors, as well as any other IC components (e.g., one or more of the interconnects discussed herein, which may take the form of any of the metallization stacks described herein). In some embodiments, the wafer 1700 or the die 1702 may include a memory device (e.g., a static random access memory (SRAM) device), a logic device (e.g., an AND, OR, NAND, or NOR gate), or any other suitable circuit element. Multiple ones of these devices may be combined on a single die 1702. For example, a memory array formed by multiple memory devices may be formed on a same die 1702 as a processing device (e.g., processor 2002 of FIG. 20) or other logic that is configured to store information in the memory devices or execute instructions stored in the memory array.

FIG. 18 is a cross-sectional side view of an IC device 1800 that may include one or more metallization stacks in accordance with any of the embodiments disclosed herein. The IC device 1800 may be formed on a substrate 1802 (e.g., the wafer 1700 of FIG. 17A) and may be included in a die (e.g., the die 1702 of FIG. 17B). The substrate 1802 may be any substrate as described herein. The substrate 1802 may be part of a singulated die (e.g., the dies 1702 of FIG. 17B) or a wafer (e.g., the wafer 1700 of FIG. 17A).

The IC device 1800 may include one or more device layers 1804 disposed on the substrate 1802. The device layer 1804 may include features of one or more transistors 1840 (e.g., metal oxide semiconductor field-effect transistors (MOSFETs)) formed on the substrate 1802. The device layer 1804 may include, for example, one or more source and/or drain (S/D) regions 1820, a gate 1822 to control current flow in the transistors 1840 between the S/D regions 1820, and one or more S/D contacts 1824 to route electrical signals to/from the S/D regions 1820. The transistors 1840 may include additional features not depicted for the sake of clarity, such as device isolation regions, gate contacts, and the like. The transistors 1840 are not limited to the type and configuration depicted in FIG. 18 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1840 may include a gate 1822 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some embodiments, when viewed as a cross section of the transistor 1840 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a finFET transistor does not have a "flat" upper surface, but instead has a rounded peak).

Generally, the gate dielectric layer of a transistor 1840 may include one layer or a stack of layers, and the one or more layers may include silicon oxide, silicon dioxide, and/or a high-k dielectric material. The high-k dielectric material included in the gate dielectric layer of the transistor 1840 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The S/D regions 1820 may be formed within the substrate 1802 adjacent to the gate 1822 of each transistor 1840, using any suitable processes known in the art. For example, the S/D regions 1820 may be formed using either an implantation/diffusion process or a deposition process. In the former process, dopants such as boron, aluminum, antimony, phosphorous, or arsenic may be ion-implanted into the substrate 1802 to form the S/D regions 1820. An annealing process that activates the dopants and causes them to diffuse farther into the substrate 1802 may follow the ion implantation process. In the latter process, an epitaxial deposition process may provide material that is used to fabricate the S/D regions 1820. In some implementations, the S/D regions 1820 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1820 may be formed using one or more alternate semiconductor materials such as germanium or a group III-V material or alloy. In further embodiments, one or more layers of metal and/or metal alloys may be used to form the S/D regions 1820. In some embodiments, an etch process may be performed before the epitaxial deposition to create recesses in the substrate 1802 in which the material for the S/D regions 1820 is deposited.

Electrical signals, such as power and/or input/output (I/O) signals, may be routed to and/or from the transistors 1840 of the device layer 1804 through one or more interconnect layers disposed on the device layer 1804 (illustrated in FIG. 18 as interconnect layers 1806-1810). For example, electrically conductive features of the device layer 1804 (e.g., the gate 1822 and the S/D contacts 1824) may be electrically coupled with the interconnect structures 1828 of the interconnect layers 1806-1810. The one or more interconnect layers 1806-2010 may form an interlayer dielectric (ILD) stack 1819 of the IC device 1800. One or more of the interconnect layers 1806-1810 may take the form of any of the embodiments of the metallization stacks disclosed herein, for example any of the embodiments discussed herein with reference to the metallization stack 100 or any of the assemblies shown in FIGS. 2-8.

The interconnect structures 1828 may be arranged within the interconnect layers 1806-2010 to route electrical signals according to a wide variety of designs (in particular, the arrangement is not limited to the particular configuration of interconnect structures 1828 depicted in FIG. 19). Although a particular number of interconnect layers 1806-2010 is depicted in FIG. 19, embodiments of the present disclosure include IC devices having more or fewer interconnect layers than depicted.

In some embodiments, the interconnect structures 1828 may include trench structures 1828a (sometimes referred to as "lines") and/or via structures 1828b (sometimes referred to as "holes") filled with an electrically conductive material such as a metal. The trench structures 1828a may be arranged to route electrical signals in a direction of a plane that is substantially parallel with a surface of the substrate 1802 upon which the device layer 1804 is formed. For example, the trench structures 1828a may route electrical signals in a direction in and out of the page from the perspective of FIG. 18. The via structures 1828b may be arranged to route electrical signals in a direction of a plane that is substantially perpendicular to the surface of the substrate 1802 upon which the device layer 1804 is formed. In some embodiments, the via structures 1828b may electrically couple trench structures 1828a of different interconnect layers 1806-2010 together.

The interconnect layers 1806-1810 may include a dielectric material 1826 disposed between the interconnect structures 1828, as shown in FIG. 18. The dielectric material 1826 may take the form of any of the embodiments of the dielectric material provided between the interconnects of the metallization stacks disclosed herein, for example any of the embodiments discussed herein with reference to the dielectric material 112, the metallization stack 100 or any of the assemblies shown in FIGS. 2-8.

In some embodiments, the dielectric material 1826 disposed between the interconnect structures 1828 in different ones of the interconnect layers 1806-1810 may have different compositions. In other embodiments, the composition of the dielectric material 1826 between different interconnect layers 1806-1810 may be the same.

A first interconnect layer 1806 (referred to as Metal 1 or "M1") may be formed directly on the device layer 1804. In some embodiments, the first interconnect layer 1806 may include trench structures 1828a and/or via structures 1828b, as shown. The trench structures 1828a of the first interconnect layer 1806 may be coupled with contacts (e.g., the S/D contacts 1824) of the device layer 1804.

A second interconnect layer 1808 (referred to as Metal 2 or "M2") may be formed directly on the first interconnect layer 1806. In some embodiments, the second interconnect layer 1808 may include via structures 1828b to couple the trench structures 1828a of the second interconnect layer 1808 with the trench structures 1828a of the first interconnect layer 1806. Although the trench structures 1828a and the via structures 1828b are structurally delineated with a line within each interconnect layer (e.g., within the second interconnect layer 1808) for the sake of clarity, the trench structures 1828a and the via structures 1828b may be structurally and/or materially contiguous (e.g., simultaneously filled during a dual-damascene process) in some embodiments.

A third interconnect layer 1810 (referred to as Metal 3 or "M3") (and additional interconnect layers, as desired) may be formed in succession on the second interconnect layer 1808 according to similar techniques and configurations described in connection with the second interconnect layer 1808 or the first interconnect layer 1806.

The IC device 1800 may include a solder resist material 1834 (e.g., polyimide or similar material) and one or more bond pads 1836 formed on the interconnect layers 1806-1810. The bond pads 1836 may be electrically coupled with the interconnect structures 1828 and configured to route the electrical signals of the transistor(s) 1840 to other external devices. For example, solder bonds may be formed on the one or more bond pads 1836 to mechanically and/or electrically couple a chip including the IC device 1800 with another component (e.g., a circuit board). The IC device 1800 may have other alternative configurations to route the electrical signals from the interconnect layers 1806-1810 than depicted in other embodiments. For example, the bond pads 1836 may be replaced by or may further include other analogous features (e.g., posts) that route the electrical signals to external components.

FIG. 19 is a cross-sectional side view of an IC device assembly 1900 that may include components having or being associated with (e.g. being electrically connected by means of) one or more metallization stacks in accordance with any of the embodiments disclosed herein. The IC device assembly 1900 includes a number of components disposed on a circuit board 1902 (which may be, e.g., a motherboard). The IC device assembly 1900 includes components disposed on a first face 1940 of the circuit board 1902 and an opposing second face 1942 of the circuit board 1902; generally, components may be disposed on one or both faces 1940 and 1942. In particular, any suitable ones of the components of the IC device assembly 1900 may include any of the metallization stacks 100 disclosed herein.

In some embodiments, the circuit board 1902 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1902. In other embodiments, the circuit board 1902 may be a non-PCB substrate.

The IC device assembly 1900 illustrated in FIG. 19 includes a package-on-interposer structure 1936 coupled to the first face 1940 of the circuit board 1902 by coupling components 1916. The coupling components 1916 may electrically and mechanically couple the package-on-interposer structure 1936 to the circuit board 1902, and may include solder balls (as shown in FIG. 19), male and female portions of a socket, an adhesive, an underfill material, and/or any other suitable electrical and/or mechanical coupling structure.

The package-on-interposer structure 1936 may include an IC package 1920 coupled to an interposer 1904 by coupling components 1918. The coupling components 1918 may take any suitable form for the application, such as the forms discussed above with reference to the coupling components 1916. Although a single IC package 1920 is shown in FIG. 19, multiple IC packages may be coupled to the interposer 1904; indeed, additional interposers may be coupled to the interposer 1904. The interposer 1904 may provide an intervening substrate used to bridge the circuit board 1902 and the IC package 1920. The IC package 1920 may be or include, for example, a die (the die 1702 of FIG. 17B), an IC device (e.g., the IC device 1800 of FIG. 18), or any other suitable component. Generally, the interposer 1904 may spread a connection to a wider pitch or reroute a connection to a different connection. For example, the interposer 1904 may couple the IC package 1920 (e.g., a die) to a ball grid array (BGA) of the coupling components 1916 for coupling to the circuit board 1902. In the embodiment illustrated in FIG. 19, the IC package 1920 and the circuit board 1902 are attached to opposing sides of the interposer 1904; in other embodiments, the IC package 1920 and the circuit board 1902 may be attached to a same side of the interposer 1904. In some embodiments, three or more components may be interconnected by way of the interposer 1904.

The interposer 1904 may be formed of an epoxy resin, a fiberglass-reinforced epoxy resin, a ceramic material, or a polymer material such as polyimide. In some implementations, the interposer 1904 may be formed of alternate rigid or flexible materials that may include the same materials described above for use in a semiconductor substrate, such as silicon, germanium, and other group III-V and group IV materials. The interposer 1904 may include metal interconnects 1908 and vias 1910, including but not limited to through-silicon vias (TSVs) 1906. The interposer 1904 may further include embedded devices 1914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 1904. The package-on-interposer structure 1936 may take the form of any of the package-on-interposer structures known in the art.

The IC device assembly 1900 may include an IC package 1924 coupled to the first face 1940 of the circuit board 1902 by coupling components 1922. The coupling components 1922 may take the form of any of the embodiments discussed above with reference to the coupling components 1916, and the IC package 1924 may take the form of any of the embodiments discussed above with reference to the IC package 1920.

The IC device assembly 1900 illustrated in FIG. 19 includes a package-on-package structure 1934 coupled to the second face 1942 of the circuit board 1902 by coupling components 1928. The package-on-package structure 1934 may include an IC package 1926 and an IC package 1932 coupled together by coupling components 1930 such that the IC package 1926 is disposed between the circuit board 1902 and the IC package 1932. The coupling components 1928 and 1930 may take the form of any of the embodiments of the coupling components 1916 discussed above, and the IC packages 1926 and 1932 may take the form of any of the embodiments of the IC package 1920 discussed above. The package-on-package structure 1934 may be configured in accordance with any of the package-on-package structures known in the art.

FIG. 20 is a block diagram of an example computing device 2000 that may include one or more components including one or more metallization stacks in accordance with any of the embodiments disclosed herein. For example, any suitable ones of the components of the computing device 2000 may include a die (e.g., the die 1702 of FIG. 17B) having one or more metallization stacks 100. Any one or more of the components of the computing device 2000 may include, or be included in, an IC device 1800 (FIG. 18). Any one or more of the components of the computing device 2000 may include, or be included in, an IC device assembly 1900 (FIG. 19).

A number of components are illustrated in FIG. 20 as included in the computing device 2000, but any one or more of these components may be omitted or duplicated, as suitable for the application. In some embodiments, some or all of the components included in the computing device 2000 may be attached to one or more motherboards. In some embodiments, some or all of these components are fabricated onto a single system-on-a-chip (SoC) die.

Additionally, in various embodiments, the computing device 2000 may not include one or more of the components illustrated in FIG. 20, but the computing device 2000 may include interface circuitry for coupling to the one or more components. For example, the computing device 2000 may not include a display device 2006, but may include display device interface circuitry (e.g., a connector and driver circuitry) to which a display device 2006 may be coupled. In another set of examples, the computing device 2000 may not include an audio input device 2024 or an audio output device 2008, but may include audio input or output device interface circuitry (e.g., connectors and supporting circuitry) to which an audio input device 2024 or audio output device 2008 may be coupled.

The computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2004 may include memory that shares a die with the processing device 2002. This memory may be used as cache memory and may include embedded dynamic random access memory (eDRAM) or spin transfer torque magnetic random-access memory (STT-MRAM).

In some embodiments, the computing device 2000 may include a communication chip 2012 (e.g., one or more communication chips). For example, the communication chip 2012 may be configured for managing wireless communications for the transfer of data to and from the computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16—2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The computing device 2000 may include battery/power circuitry 2014. The battery/power circuitry 2014 may include one or more energy storage devices (e.g., batteries or capacitors) and/or circuitry for coupling components of the computing device 2000 to an energy source separate from the computing device 2000 (e.g., AC line power).

The computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The computing device 2000 may include an audio output device 2008 (or corresponding interface circuitry, as discussed above). The audio output device 2008 may include any device that generates an audible indicator, such as speakers, headsets, or earbuds, for example.

The computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The computing device 2000 may include a global positioning system (GPS) device 2018 (or corresponding interface circuitry, as discussed above). The GPS device 2018 may be in communication with a satellite-based system and may receive a location of the computing device 2000, as known in the art.

The computing device 2000 may include another output device 2010 (or corresponding interface circuitry, as discussed above). Examples of the other output device 2010 may include an audio codec, a video codec, a printer, a wired or wireless transmitter for providing information to other devices, or an additional storage device.

The computing device 2000 may include another input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2000 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2000 may be any other electronic device that processes data.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 (pre-AIA) or paragraph (f) of the same section (post-AIA), as it exists on the date of the filing hereof unless the words "means for" or "steps for" are specifically used in the particular claims; and (b) does not intend, by any statement in the specification, to limit this disclosure in any way that is not otherwise expressly reflected in the appended claims.

Example Implementations

There is disclosed in one example, a configurable impedance element, comprising: a first impedance network comprising a plurality of series impedance elements and providing an initial impedance; a trim impedance network parallel to the first impedance network, comprising a plurality of corresponding impedance elements to the impedance elements of the first impedance network; and antifuses between the impedance elements of the first impedance network and their corresponding impedance elements of the trim network.

There is further disclosed an example, wherein the first impedance is a near-nominal impedance.

There is further disclosed an example, wherein the antifuses comprise a dielectric material having a breakdown potential.

There is further disclosed an example, wherein the breakdown potential varies by dielectric thickness, and wherein the breakdown potential is approximately 1 volt per nanometer.

There is further disclosed an example, wherein the dielectric thickness is approximately 5 nm.

There is further disclosed an example, wherein the dielectric breakdown potential is approximately 5V.

There is further disclosed an example, wherein the dielectric material comprises a nanoparticle.

There is further disclosed an example, wherein the dielectric material comprises an organic conducting polymer.

There is further disclosed an example, wherein the dielectric material comprises a spin-on dielectric with an additive.

There is further disclosed an example, wherein the impedance element is an Ohmic resistor substantially within operating voltage and current conditions of the impedance element.

There is further disclosed an example of an integrated circuit, comprising: a digital logic circuit comprising a plurality of transistors; and a configurable impedance element comprising: a first impedance network comprising a plurality of series impedance elements and providing an initial impedance; a trim impedance network parallel to the first impedance network, comprising a plurality of corresponding impedance elements to the impedance elements of the first impedance network; and antifuses between the impedance elements of the first impedance network and their corresponding impedance elements of the trim network.

There is further disclosed an example, wherein the first impedance is a near-nominal impedance.

There is further disclosed an example, wherein the antifuses comprise a dielectric material having a breakdown potential.

There is further disclosed an example, wherein the breakdown potential varies by dielectric thickness, and wherein the breakdown potential is approximately 1 volt per nanometer.

There is further disclosed an example, wherein the dielectric thickness is approximately 5 nm.

There is further disclosed an example, wherein the dielectric breakdown potential is approximately 5V.

There is further disclosed an example, wherein the dielectric material comprises a nanoparticle.

There is further disclosed an example, wherein the dielectric material comprises an organic conducting polymer.

There is further disclosed an example, wherein the dielectric material comprises a spin-on dielectric with an additive.

There is further disclosed an example, wherein the impedance element is an Ohmic resistor substantially within operating voltage and current conditions of the impedance element.

There is further disclosed an example of a method of manufacturing an integrated circuit, comprising: depositing a first thin film resistive layer; patterning the thin film resistive layer; depositing an antifuse layer, comprising thin film patterning of a dielectric material having antifuse properties; depositing an inter-layer dielectric layer; depositing a second thin film resistive layer; and patterning the second thin film resistive layer; wherein the first thin film resistive layer and second film resistive layer form a resistive element, comprising: a first impedance network comprising a plurality of series impedance elements and providing an initial impedance; a trim impedance network parallel to the first impedance network, comprising a plurality of corresponding impedance elements to the impedance elements of the first impedance network; and antifuses between the impedance elements of the first impedance network and their corresponding impedance elements of the trim network.

There is further disclosed an example, further comprising measuring a resistance of the resistance element, comparing the resistance to a nominal resistance, and manipulating the trim array to more closely conform the resistance to the nominal resistance, as compared to the measured resistance of the resistive element.

There is further disclosed an example, wherein manipulating the trim array comprises applying a potential difference between the first resistive network and second resistive network.

There is further disclosed an example, further comprising selecting the potential difference to blow fewer than all of the antifuses.

There is further disclosed an example, wherein applying the potential difference comprises applying the potential difference for a time selected to blow fewer than all of the antifuses.

What is claimed is:

1. A configurable impedance element, comprising:
a first impedance network comprising a plurality of series impedance elements, wherein the first impedance network includes a first thin film resistive layer;
a trim impedance network parallel to the first impedance network, comprising a plurality of corresponding impedance elements to the impedance elements of the first impedance network, wherein the trim impedance network includes a second thin film resistive layer; and
antifuses between the impedance elements of the first impedance network and their corresponding impedance elements of the trim impedance network, the antifuses correspond to locations along the first thin film resistive layer at which the first thin film resistive layer is spaced apart from the second thin film resistive layer by first distances, the impedance elements of the first impedance network correspond to locations along the first thin film resistive layer at which the first thin film resistive layer is spaced apart from the second thin film resistive layer by second distances, and the first distances are less than the second distances.

2. The configurable impedance element of claim 1, wherein the antifuses comprise an antifuse dielectric between the first thin film resistive layer and the second thin film resistive layer, an interlayer dielectric is between the impedance elements of the first impedance network and the corresponding impedance elements of the trim impedance network, and the interlayer dielectric has a different material composition than the antifuse dielectric.

3. The configurable impedance element of claim 2, wherein the antifuse dielectric comprises a nanoparticle.

4. The configurable impedance element of claim 2, wherein the antifuse dielectric comprises an organic conducting polymer.

5. The configurable impedance element of claim 2, wherein the antifuse dielectric is between the impedance elements of the first impedance network and the corresponding impedance elements of the second impedance network.

6. The configurable impedance element of claim 1, wherein the antifuses correspond to locations along the first thin film resistive layer at which the first thin film resistive layer is spaced apart from the second thin film resistive layer by first dielectric material regions having a first breakdown potential, the impedance elements of the first impedance network correspond to locations along the first thin film resistive layer at which the first thin film resistive layer is spaced apart from the second thin film resistive layer by second dielectric material regions having a second breakdown potential, and the first breakdown potential is less than the second breakdown potential.

7. An integrated circuit, comprising:
a digital logic circuit comprising a plurality of transistors; and
an impedance element comprising:
a first impedance network comprising a plurality of series impedance elements, wherein the first impedance network includes a first thin film resistive layer;
a trim impedance network parallel to the first impedance network, comprising a plurality of corresponding impedance elements to the impedance elements of the first impedance network, wherein the trim impedance network includes a second thin film resistive layer; and
antifuses between the impedance elements of the first impedance network and their corresponding impedance elements of the trim impedance network, the antifuses correspond to locations along the first thin film resistive layer at which the first thin film resistive layer is spaced apart from the second thin film resistive layer by first dielectric material regions having a first breakdown potential, the impedance elements of the first impedance network correspond to locations along the first thin film resistive layer at which the first thin film resistive layer is spaced apart from the second thin film resistive layer by second dielectric material regions having a second breakdown potential, and the first breakdown potential is less than the second breakdown potential.

8. The integrated circuit of claim 7, wherein the first breakdown potential is approximately 1 volt per nanometer.

9. The integrated circuit of claim 7, wherein a thickness of a first dielectric material region is approximately 5 nm.

10. The integrated circuit of claim 7, wherein the first breakdown potential of a first dielectric material region is approximately 5V.

11. The integrated circuit of claim 7, wherein a first dielectric material region comprises a nanoparticle.

12. The integrated circuit of claim 7, wherein a first dielectric material region comprises an organic conducting polymer.

13. The integrated circuit of claim 7, wherein the antifuses correspond to locations along the first thin film resistive layer at which the first thin film resistive layer is spaced apart from the second thin film resistive layer by first distances, the impedance elements of the first impedance network correspond to locations along the first thin film resistive layer at which the first thin film resistive layer is spaced apart from the second thin film resistive layer by second distances, and the first distances are less than the second distances.

14. The integrated circuit of claim 7, wherein the first dielectric material regions include an antifuse dielectric, and the second dielectric material regions include the antifuse dielectric.

* * * * *